United States Patent [19]
Horino et al.

[11] Patent Number: 6,072,197
[45] Date of Patent: *Jun. 6, 2000

[54] SEMICONDUCTOR LIGHT EMITTING DEVICE WITH AN ACTIVE LAYER MADE OF SEMICONDUCTOR HAVING UNIAXIAL ANISOTROPY

[75] Inventors: Kazuhiko Horino; Kay Domen, both of Kanagawa, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/805,336

[22] Filed: Feb. 24, 1997

[30] Foreign Application Priority Data

| Feb. 23, 1996 | [JP] | Japan | 8-035948 |
| Aug. 2, 1996 | [JP] | Japan | 8-204473 |
| Sep. 6, 1996 | [JP] | Japan | 8-236650 |

[51] Int. Cl.[7] .............. H01L 33/00; H01L 29/04
[52] U.S. Cl. ............ 257/103; 257/98; 257/627; 257/628; 257/94
[58] Field of Search .............. 257/88, 94, 103, 257/627, 628, 98; 372/45, 46

[56] References Cited

U.S. PATENT DOCUMENTS

| 5,604,763 | 2/1997 | Kato et al. | 372/45 |
| 5,625,202 | 4/1997 | Chai | 257/94 |

FOREIGN PATENT DOCUMENTS 8-125275A  5/1996  Japan.

*Primary Examiner*—Minh Loan Tran
*Attorney, Agent, or Firm*—Armstrong, Westerman, Hattori, McLeland & Naughton

[57] ABSTRACT

A semiconductor light emitting device includes a second semiconductor layer, an active layer, a third semiconductor layer and a pair of electrodes. The second semiconductor layer is formed directly on the principal pane of a substrate or via a first semiconductor layer. The active layer is formed on the second semiconductor layer and has an energy band gap which is smaller than the energy band gap of the second semiconductor layer. The active layer is made of a semiconductor having an uniaxial anisotropy. The third semiconductor layer is formed on the active layer and has the energy band gap which is larger than the energy band gap of the active layer. The pair of electrodes supplies current to the second semiconductor layer, the active layer, and the third semiconductor layer in the film thickness direction. The film thickness direction of at least the active layer is different from the axis of the uniaxial anisotropy.

41 Claims, 23 Drawing Sheets

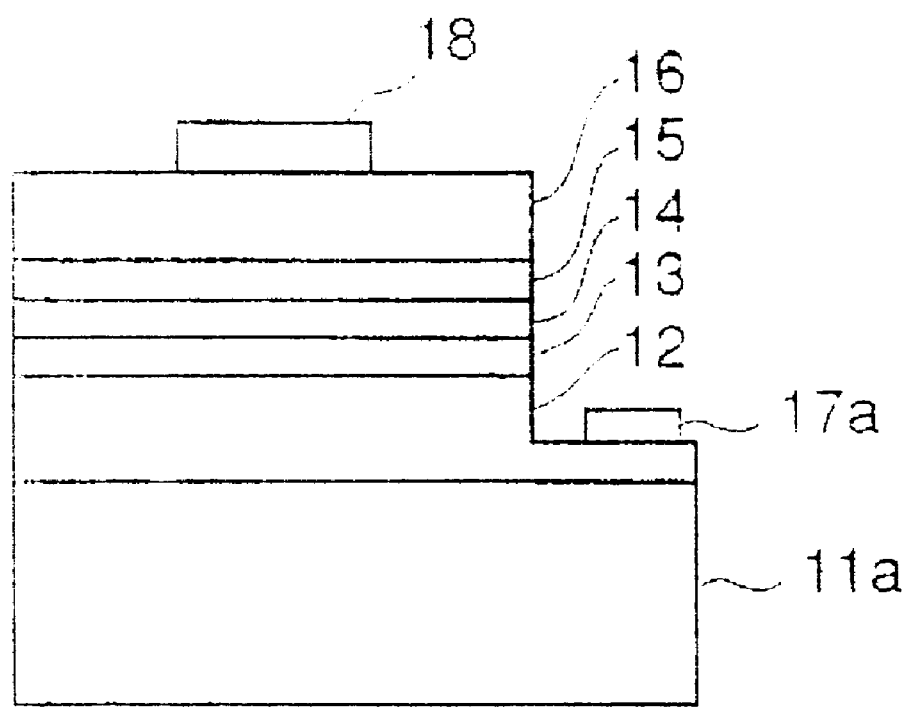

(1̄100) plane
or (112̄1) plane

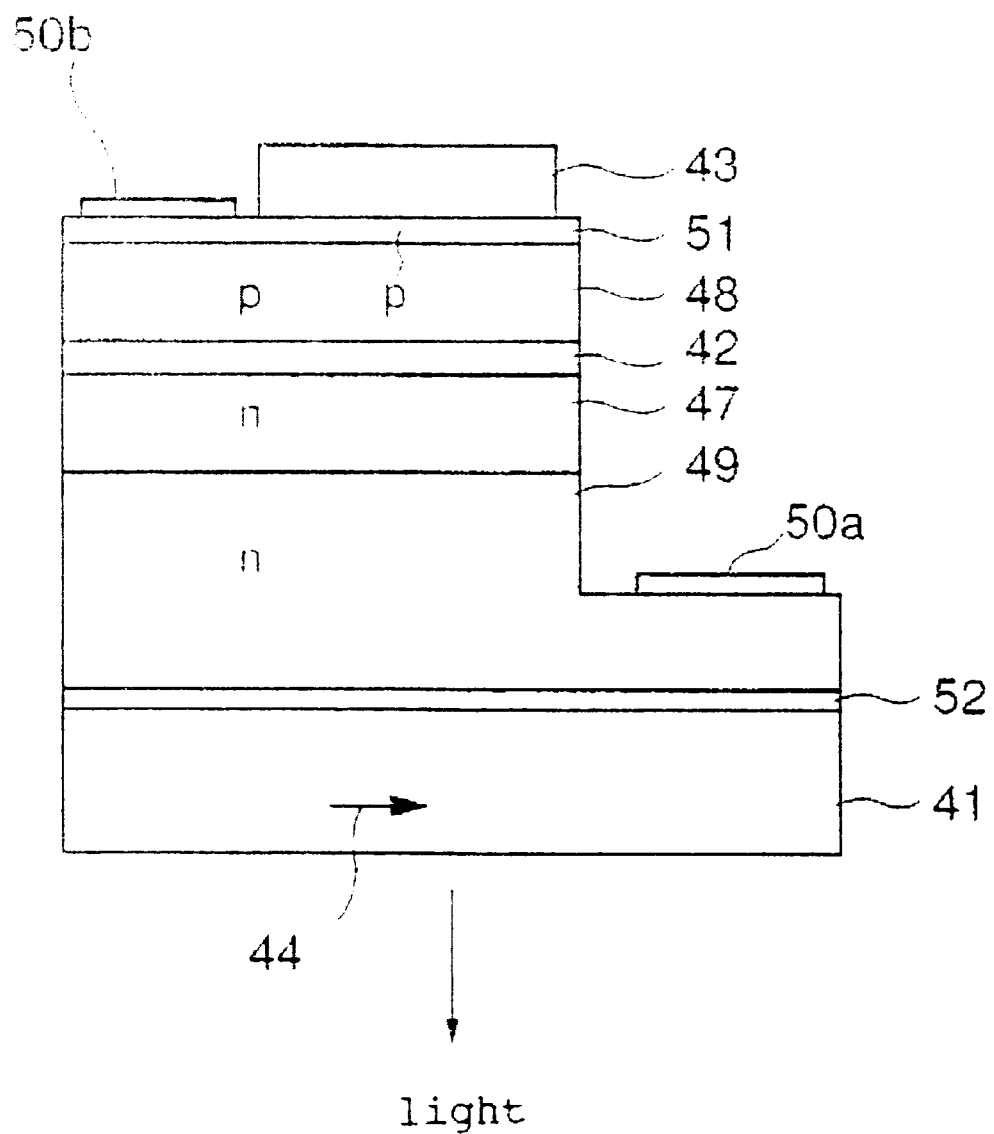

SEMICONDUCTOR LIGHT EMITTING DEVICE WITH AN ACTIVE LAYER MADE OF SEMICONDUCTOR HAVING UNIAXIAL ANISOTROPY

BACKGROUND OF THE INVENTION

1. Field of the Invention

The present invention relates to a semiconductor light emitting device, an optical semiconductor device, a light emitting diode and a display device and, more particularly, a semiconductor light emitting device, an optical semiconductor device, a light emitting diode and a display device all using as a light emitting portion a wurtzite compound semiconductor such as GaN which is able to emit a light having a wavelength ranging over blue to ultraviolet.

2. Description of the Prior Art

In recent years, development of a short wavelength laser which has a wavelength in the range of blue to ultraviolet and used as an optical disk light source has been carried out extensively. As a blue laser light source, there have been optical devices using II-VI ZnSe system material and II-V GaN system material. The ZnSe system material has been ahead of the GaN system material in research of the semiconductor laser and further room-temperature continuous oscillation by means of the ZnSe system material has already been reported. However, since degradation easily occurs in the ZnSe system material in essential, the ZnSe system material has the problem in reliability and therefore it has not been put to practical use yet.

In contrast, after high luminance LED using GaN system material has been published several years ago, the GaN system material being excellent in the environmental resistance has been reconsidered and the researcher have been increased in number all over the world. The semiconductor laser which enables laser oscillation by the InGaN system material has been published by Nichia Chemical Ltd. in the year 1996.

Since the GaN system semiconductor used as the light emitting device may be formed of wurtzite compound semiconductor, it has been epitaxially grown on a hexagonal system sapphire substrate or 6H—SiC substrate, which has a similar crystal structure, by virtue of the MOVPE (metal organic chemical vapor deposition) method. Where a notation "H" of 6H—SiC denotes a crystal having six-fold symmetry, and a notation "6" denotes a crystal having a six phase synchronization structure in which atomic or molecular alignment are periodically formed in six phases.

Formation of the semiconductor laser using the hexagonal system sapphire substrate or 6H—SiC substrate will be made according to following procedures.

In the case of the sapphire substrate, for example, as shown in FIG. 24A, an n type $Al_{0.1}Ga_{0.9}N$ cladding layer 143, an n type GaN light guide layer 144, a $Ga_{0.9}In_{0.1}N$ active layer 145, a p type GaN light guide layer 146, and a p type $Al_{0.1}Ga_{0.9}N$ cladding layer 147 are epitaxially grown via a GaN buffer layer 142 on a sapphire (0001) substrate 141 using (0001) plane as the principal plane virtue of the MOVPE method, and then part of the n type $Al_{0.1}Ga_{0.9}N$ cladding layer 143 is exposed by etching. An n side electrode made of a Ti/Au electrode 148 is provided on an exposed surface of the n type $Al_{0.1}Ga_{0.9}N$ cladding layer 143, and a p side electrode made of an Ni/Au electrode 149 is also provided on the p type $Al_{0.1}Ga_{0.9}N$ cladding layer 147. Thus a semiconductor laser is completed via above steps.

On the contrary, in the case of the 6H—SiC substrate, as shown in FIG. 24B, an n type $Al_{0.1}Ga_{0.9}N$ cladding layer 153, an n type GaN light guide layer 154, a $Ga_{0.9}In_{0.1}N$ active layer 155, a p type GaN light guide layer 156, and a p type $Al_{0.1}Ga_{0.9}N$ cladding layer 157 are epitaxially grown via an n type AlN buffer layer 152 on a (0001) Si face, i.e., Si face of a 6H—SiC (0001) substrate 151 by virtue of the MOVPE method. An n side electrode made of a Ti/Au electrode 158 is provided on a back surface of the 6H—SiC (0001) substrate 151, and a p side electrode made of an Ni/Au electrode 159 is also provided on the p type $Al_{0.1}Ga_{0.9}N$ cladding layer 157. Thus a semiconductor laser is completed via above steps.

In such conventional light emitting devices, since (0001) faces of GaN system epitaxial layers 142 to 147 and 152 to 157 are grown in the <0001> direction of the sapphire (0001) substrate 141 or the 6H—SiC (0001) substrate 151, distortion in the plane becomes isotropic and therefore the $Ga_{0.9}In_{0.1}N$ active layers 145, 155 still remain as uniaxial anisotropy. The <0001> direction is the c axis direction.

Next, an energy band structure of the GaN system semiconductor will be explained.

FIG. 25A shows a band structure of valence band of the GaN system semiconductor to which no distortion is applied. In FIG. 25A, HH (Heavy Hole) and LH (Light Hole) bands are nearly degenerated and a CH (Crystalline field split Hole) band is near HH and LH.

In the conventional light emitting device shown in FIG. 24A, since in-plane lattice constants of the n type $Al_{0.1}Ga_{0.9}N$ cladding layer 143 to the p type $Al_{0.1}Ga_{0.9}N$ cladding layer 147 are defined by a lattice constant of the n type $Al_{0.1}Ga_{0.9}N$ cladding layer 143 directly over the GaN buffer layer 142, the n type GaN light guide layer 144 to the p type GaN light guide layer 146, all grown coherently, undergo compressive stress due to lattice mismatching and difference in thermal expansion coefficient.

Similarly, the device shown in FIG. 24B undergoes tensile stress, but compressive stress is imposed on the $Ga_{0.9}IN_{0.1}N$ active layer 155 because of strong influence of distortion due to the lattice constant.

The inventors of the present invention have found the fact that optical gain of GaN is very high in contrast to conventional material and therefore this material is suitable for a surface emittingtype semiconductor laser.

Then, the surface emitting type semiconductor laser will be explained.

The semiconductor laser has an optical resonator (vertical resonator) which has a resonance axis along the direction vertical to the active layer formed on the substrate, and has a structure for emitting the light in the direction perpendicular to a surface of the active layer. Such surface emitting type semiconductor laser has such advantageous features in characteristic and manufacturing that threshold current is low because of a short length of the resonator, a two dimensional array of the semiconductor laser elements can be easily achieved, the number of elements per unit wafer area can be made large, device test can be conducted as the wafer, etc. Accordingly, the surface emitting type semiconductor laser for oscillating a short wavelength light has been developed for use in optical disk or short distance optical communication.

However, since a direction of the polarozation plane of the oscillation light is not fixed in the surface emitting type semiconductor laser in the prior art, in some cases the polarozation plane varied in use, otherwise kink appears in thee oscillation light output characteristic owing to variation in the polarozation plane. In such event, reading of the optical disk by virtue of polarization of light cannot be effected, and writing/reading by using the light cannot be effected stably, and stable communication cannot be achieved.

Therefore, it has been requested to fix and stabilize face orientation of the light oscillated from the surface emitting type semiconductor laser.

In the prior art, the active layer of the surface emitting type semiconductor laser has been deposited on the substrate using (001) plane of a zincblende crystal as the principal plane. Meanwhile, if the surface emitting type semiconductor laser in which the hexagonal semiconductor representative of GaN is used as the active layer is composed of the similar structure, it will be expected that the active layer is deposited on the substrate which uses (0001) plane perpendicular to the c axis of the hexagonal crystal as the principal plane. The conventional surface emitting type semiconductor laser having such structure will be explained hereinbelow.

FIG. 26 is a perspective view showing the surface emitting type semiconductor laser in the prior art and represents a basic structure of the surface emitting type semiconductor laser having the vertical resonator.

In FIG. 26, a substrate 101 is formed of a hexagonal crystal, e.g., sapphire and has the principal plane perpendicular to the c axis 104. Alternatively, the substrate 1 uses (001) plane of the zincblende crystal as the principal plane. A first conduction type barrier layer 107, an active layer 102, and a second conduction type barrier layer 108 are formed in sequence on the substrate 101. Then, a reflection mirror 103 made of a circular disk type multi-layered film is formed on the second conduction type barrier layer 108. With the use of the reflection mirror 103 as one reflection surface and a bottom surface of the barrier layer 107, i.e., a boundary surface between the barrier layer 107 and the substrate 101 as another reflection surface, an optical resonator having the reflection surface parallel with the active layer 102 and the resonance axis perpendicular to the active layer 102 can be obtained.

In the surface emitting type semiconductor laser which has the active layer formed of the zincblende crystal and is available at present, the reflection mirrors 103 have a multi-layered structure of semiconductor and are provided on both reflection surfaces of the optical resonator.

Conversely, the surface emitting type semiconductor laser using GaN, which is large in optical gain, as the active layer makes it possible to oscillate the light by using the reflection mirror 103 provided on one surface. The oscillation light is transmitted from an optical window which is formed on the lower face (opposite face to the principal plane) of the substrate 101. In the surface emitting type semiconductor laser, the active layer 102 is deposited eptaxially on the substrate 101. Accordingly, the active layer 102 made of hexagonal or zincblende crystal is formed as a thin layer in which the c axis of the hexagonal crystal or <001> axis of the zincblende crystal is perpendicular to the face.

On the other hand, since the resonator has the resonance axis perpendicular to the active layer 102, the oscillation light travels perpendicularly to the active layer 102 and the face of the active layer 102 serves as a polarization defining face. In other words, if an xy face is assumed to the polarization defining face and travel direction of the light is assumed to the z axis, the oscillation light consists of x polarized light 105 whose polarozation plane includes the x axis and y polarized light 106 whose polarozation plane includes the y axis. Since the z axis is perpendicular to the active layer 2, i.e., is parallel with the c axis of the hexagonal crystal or the <001> axis of the zincblende crystal and constitutes an axis of rotational symmetry in optical anisotropy, the x polarized light 105 and the y polarized light 106 have equal optical coupling for the crystal. Therefore, since the x polarized light 105 and the y polarized light 106 can be oscillated crystallographically at equal intensity, the polarozation plane of the oscillation light is not fixed and thus the polarozation plane becomes unstable.

In order to stabilize the polarozation plane of the oscillation light, such a semiconductor laser has been developed that only one of the x polarized light 105 and the y polarized light 106 can be oscillated by forming the reflection mirror as an elliptic or rectangular shape. However, this semiconductor laser has problems such that the emitted light cannot be formed as a circular beam and that it is hard to manufacture the shape of the reflection mirror precisely.

Further, in order to overcome such disadvantages, a semiconductor device has been proposed wherein symmetry of refractive index around the z axis is degraded by forming in-plane refractive index distribution in the active layer 102 or the barrier layers 107, 108 to thus define the polarozation plane of the oscillation light. However, since additional steps to form the refractive index distribution are needed, such situation is unavoidable that manufacturing steps is made complicated.

In the case of the conventional GaN system semiconductor, since highest energy bands HH, LH in valence band are degenerated doubly, hols are distributed in both HH and LH in this GaN system semiconductor. As a result, there has been the problem that threshold current density to cause laser oscillation is enhanced.

Upon growing the GaN system semiconductor on the 6H—SiC substrate, cracks easily occur on (0001) plane of the GaN system semiconductor layer due to thermal expansion stress and therefore it is difficult to obtain good crystal quality.

Then, in case compressive stress due to difference in thermal expansion coefficient and lattice mismatching is imposed on the $Ga_{0.9}In_{0.1}N$ active layers 145, 155 constituting the light emitting portion in (001) face, as shown in FIG. 25B, energy in the CH band transfers from non-distortion state to a band structure which is relatively lower than HH, LH bands, but highest energy bands HH, LH in valence band are still degenerated doubly.

In addition, as another cause for higher threshold current density, it may also be considered that the sapphire substrate ha no cleavability.

As other problem in addition to the above problems in the conventional surface emitting type semiconductor laser having the vertical resonator, the polarozation plane of the oscillation light cannot be fixed because of small in-plane anisotropy of the active layer so that the polarozation plane of the emitted light cannot be fixed or oscillation becomes unstable.

In the structure in which the polarization plane is specified by forming the reflection mirror as the rectangular shape, there have been the problems that the emitted light does not form the circular beam and the rectangular pattern is hard to be formed with the progress of miniaturization. In addition, in the case where in-plane refractive index is formed in the active layer or the barrier layer, simplification in manufacturing steps is limited.

If the surface emitting type semiconductor laser is employed as the light source of the magneto-optic disk drive, different problem arises due to undefined polarozation plane of the oscillation light.

More particularly, in the magneto-optic disk drive, uniform light polarization planes of the laser light are required since data are read by detecting rotation of light polarization plane of the light. However, since the light polarization plane is not made uniform in the conventional surface emitting type semiconductor laser, such laser has not been employed as a data reading device.

SUMMARY OF THE INVENTION

It is an object of the present invention is to provide a semiconductor light emitting device which includes such a GaN system semiconductor layer that a threshold current density necessary for laser oscillation is reduced to thus render generation of crack difficult, a semiconductor light emitting device which is able to fix an polarozation plane of light and suppress fluctuation of the polarozation plane, and a display device which is able to display stereoscopic images with the use of light emitting diodes.

In the present invention, since the principal plane of the crystal substrate is selected to a fixed orientation, the c axis of the hexagonal or wurtzite semiconductor layer formed on the crystal substrate is directed not to be perpendicular to a surface of the semiconductor layer.

Accordingly, compressive or tensile distortion, if applied to the hexagonal or wurtzite semiconductor layer formed on the crystal substrate along a surface direction, results in triaxial anisotropy in the active layer. As a result, degeneracy of valence band in the active layer is released so that threshold current necessary for oscillation in the semiconductor laser having such active layer is reduced.

In addition, in such as the structure, the light emitting light polarization plane of the compound semiconductor layer formed on the crystal substrate can be determined uniquely. Therefore, if a surface emitting type semiconductor laser is fabricated by using the barrier layer, the active layer, etc. in-plane anisotropy of the active layer is enhanced. And, by enhancing the in-plane anisotropy, electric field vector is oriented to the fixed one direction, therefore the polarization is determined.

In this manner, if the polarozation plane of the oscillation light of the surface emitting type semiconductor laser is determined uniquely, not only such semiconductor laser can be used as a light source of an magneto-optic disk drive but also manufacture of the light receiving device on the same substrate as the surface emitting type semiconductor laser can be facilitated. Thereby, an operation to connect the semiconductor laser to the light receiving device can be eliminated, and miniaturization of the light emitting device and the light receiving device can be further accelerated.

The wurtzite structure such as GaN, tetragonal crystal such as $LiAlO_2$, and hexagonal crystal such as sapphire, 6H—SiC may be used selectively as the crystal substrate. The $(1\bar{1}00)$ plane or $(11\bar{2}0)$ plane may be selected as the principal plane of the crystal substrate.

Meanwhile, if the c axis of the wurtzite compound semiconductor crystal constituting the light emitting diode is directed to intersect orthogonally with the light emission direction, the polarization direction of the crystal is determined. Hence, a plurality of such light emitting diodes may be aligned on a display surface of the display device such that a part or full pixel is composed of one light emitting diode and also polarization directions between adjacent light emitting diodes are made different from each other by 20°. As a result, the light emitting diodes with polarization direction for right eye and the light emitting diodes with polarization direction for left eye can be aligned adjacently. Thus polarizer can be omitted from a stereoscopic display device to thus reduce the number of items, whereby reducing a manufacturing cost of the display device. In addition, images on such display device can be made brighter.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3 is a side view showing a structure achieved if a substrate of a substrate of a semiconductor laser employing the layer structure according to the first embodiment of the present invention is made of highly resistive material;

FIG. 17 is a sectional view showing a structure of the surface emitting type semiconductor laser according to the second embodiment of the present invention;

DETAILED DESCRIPTION OF THE EMBODIMENTS

Figure 1A:
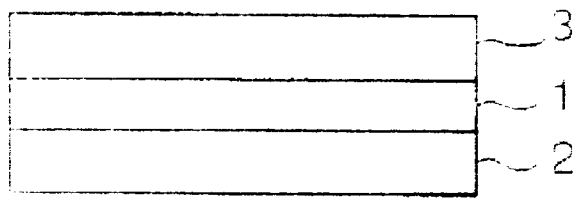
FIG. 1A is a schematic side view showing a layer structure consisting of cladding layers and an active layer according to a first embodiment of the present invention.

Various embodiments of the present invention will be described with reference to the accompanying drawings. It should be noted that the same or similar reference numerals are applied to the same or similar parts and elements throughout the drawings, and the description of the same or similar parts and elements will be omitted or simplified.

First Embodiment

Figure 1B:
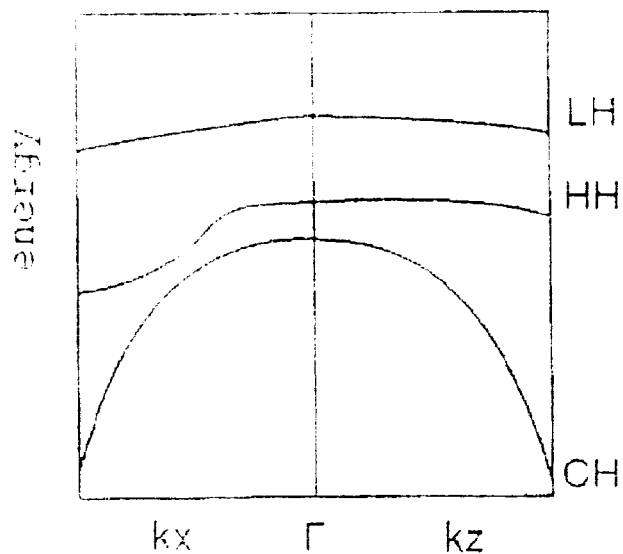
FIG. 1B is a band diagram showing an energy band structure of valence band of the active layer obtained by the layer structure in FIG. 1A.

FIGS. 1A and 1B show a semiconductor laser according to a first embodiment of the present invention.

In the semiconductor laser shown in FIGS. 1A and 1B, a first semiconductor layer 1 having a uniaxial anisotropic crystal structure is used as a light emitting portion, and triaxial anisotropy is applied to the structure by imposing distortion in a plane of the first semiconductor layer 1 which is not perpendicular to an axis exhibiting anisotropy.

In this manner, if distortion is imposed in a plane which is not perpendicular to the axis exhibiting anisotropy (i.e., c axis), triaxial anisotropy is caused by imposed distortion isotropically in respective orientations. As a result, degeneracy of HH and LH in valence band is released to thus reduce threshold current density required for laser oscillation.

In other words, as shown in FIG. 1B, since HH and LH bands at uppermost level in energy is released and differences in energy are caused among respective LH, HH and CH bands, carriers have to be transferred to only HH to enable the laser oscillation. Thus threshold current density can be reduced substantially. In present invention, the direction of a reasonator is perpendicutar to the direction of an electric field vector which is determined by the polarization of the top band.

In contrast, as described in the prior art, in the semiconductor laser having the active layer in which compressive stress is applied in the (0001) plane of the GaInN layer perpendicular to the c axis, both HH and LH bands must be filled up by carriers to enable laser oscillation, thereby increasing threshold current density.

In FIG. 1A, the first semiconductor layer 1 is put between a second semiconductor layer 2 and a third semiconductor layer 3 both having different lattice constants from the first semiconductor layer 1, and further interfaces between these layers are set not to be perpendicular to an axis exhibiting anisotropy in the first semiconductor layer 1.

In this fashion, if a principal plane of the light emitting portion formed of the first semiconductor layer 1 is composed of a plane which is not perpendicular to the c axis and then the first semiconductor layer 1 is sandwiched by the second semiconductor layer 2 and the third semiconductor layer 3 both having different lattice constants from the first semiconductor layer 1, distortion is applied in a plane not perpendicular to the c axis based on difference in these lattice constants, so that triaxial anisotropy is provided to the light emitting portion.

Next, materials and crystal lattice constants of the first to third semiconductor layers 1, 2, 3 will be explained.

As constituent material of the first semiconductor layer 1, $Al_xGa_{1-x-y}In_yN$ (where $0 \leq x \leq 1$, $0 \leq y \leq 1$) may be utilized, for example. Such wurtzite nitrogen system semiconductor is most typical and useful as semiconductor material for light emitting device having uniaxial anisotropy.

As constituent material of the second semiconductor layer 2, $Al_uGa_{1-u-v}In_vN$ (where $0 \leq u \leq 1$, $0 \leq v \leq 1$) may be utilized. Further, as constituent material of the third semiconductor layer 3, $Al_wGa_{1-w-z}In_zN$ (where $0 \leq w \leq 1$, $0 \leq z \leq 1$) may be utilized. If the second semiconductor layer 2 and the third semiconductor layer 3 is formed of GaN system semiconductor which has a different mixed crystal ratio from the first semiconductor layer 1 made of the same GaN system semiconductor, stress may be applied to the first semiconductor layer 1 without damage of crystal quality of the first semiconductor layer 1. In this case, similar mixed crystal ratios may be used in the second semiconductor layer 2 and the third semiconductor layer 3.

Further, a lattice constant a1 along a axis of the first semiconductor layer 1 and respective lattice constant a2, a3 along a axis of the second semiconductor layer 2 and the third semiconductor layer 3 are selected to satisfy respective relations a1<a2 and a1<a3.

Still further, lattice constant c1 along c axis of the first semiconductor layer 1 and respective lattice constants c2, c3 along c axis of the second semiconductor layer 2 and the third semiconductor layer 3 are selected to satisfy respective relations c1<c2, and c1<c3.

Such lattice constant relations make it possible to apply biaxial in-plane tensile stress to the first semiconductor layer 1 to thus release degeneracy in energy band and reduce threshold current density. In this event, difference in energy between highest energy band and second highest energy band in valence band is increased rather than the case where compressive stress is applied (see FIGS. 14A–14E) and LH become top band, so that threshold current density can be reduced much more.

In contrast, the lattice constant a1 along a axis of the first semiconductor layer 1 of the second semiconductor layer 2 and the third semiconductor layer 3 are selected to satisfy respective relations a1>a2 and a1>a3.

Further, the lattice constant c1 along c axis of the first semiconductor layer 1 and respective lattice constants c2, c3 along c axis of the second semiconductor layer 2 and the third semiconductor layer 3 are selected to satisfy respective relations c1>c2 and c1>c3.

Such lattice constant relations make it possible to apply compressive stress to the first semiconductor layer 1 to therefore release degeneracy in energy band and reduce threshold current density. In this case, it is less likely that crack is generated rather than the case where tensile stress is applied, so that reliability of the device can be enhanced.

Materials and film thicknesses of respective layers are selected such that energy band gaps of the second semiconductor layer 2 and the third semiconductor layer 3 are larger than energy band gap of the first semiconductor layer 1. If energy band gaps are set as above, confinement of light and carrier in the first semiconductor layer 1 can be improved and therefore effective light emission can be carried out.

As the constituent material of the substrate for the semiconductor laser, GaN, AlN, or SiC may be selected. In case any one of GaN, AlN, or SiC having uniaxial anisotropy crystal structure is used as the semiconductor substrate constituting the semiconductor laser, triaxial anistropy can be brought about in the first semiconductor layer 1 by selecting the principal plane appropriately when distortion is applied to the first semiconductor layer 1 formed on the substrate.

The same composition as the substrate is provided to the semiconductor layer to be formed first on the substrate constituting the semiconductor laser. For instance, if GaN system mixed crystal substrate is used, the cladding layer having the same composition is directly provided on the substrate. Thus distortion can be applied effectively to the first semiconductor layer 1 constituting a light emitting portion formed on the cladding layer.

Next, face orientation of the substrate described above will be explained.

The principal plane of the semiconductor substrate constituting the semiconductor laser is formed as a face inclined from $\{1\,\bar{1}00\}$ plane or $\{11\,\bar{2}0\}$ plane by an off angle θ (where $0° \leq θ \leq 10°$). In this disclosure, characters to be expressed by "1 bar" or "2 bar" usually are "−1" or "−2" for convenience' sake.

Figure 1C:
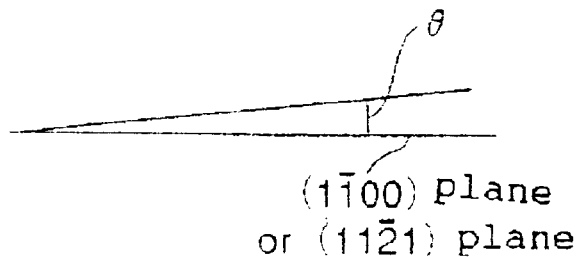
FIG. 1C is a sketch illustrative of face orientation of a principal plane of a substrate used in the first embodiment of the present invention.

In the event that a semiconductor having a uniaxial anisotropic crystal structure is utilized as the substrate constituting the semiconductor laser, triaxial anisotropy is caused by applying distortion to the first semiconductor layer 1 formed on the substrate if the principal plane of the substrate is set to $\{1\,\bar{1}00\}$ plane or $\{11\,\bar{2}0\}$ face. In this case, as shown in FIG. 1C, the principal plane may be inclined by the off angle θ (where $0° \leq θ \leq 10°$) to suppress generation of twin, etc.

A cleavage plane consisting of the resonator of the semiconductor laser may be set to any one of $\{0001\}$ face, $\{1\,\bar{1}00\}$ plane and $\{11\,\bar{2}0\}$ face.

If $\{1\,\bar{1}00\}$ plane is used as the principal plane of the growth substrate, $\{0001\}$ plane or $\{11\,\bar{2}0\}$ plane becomes the cleavage plane perpendicular to the principal plane of the growth substrate. Alternatively, if $\{11\,\bar{2}0\}$ plane is used as the principal plane of the growth substrate, $\{0001\}$ plane or $\{1\,\bar{1}00\}$ plane becomes the cleavage plane perpendicular to the principal plane of the growth substrate. In this case, the resonator is made up of two cleavage planes in the first semiconductor layer 1.

Further, {0001} plane is used as the principal plane of the semiconductor substrate constituting the semiconductor laser, then a facet other than {0001} plane is provided on a surface of the substrate, and then the first semiconductor layer 1 provided on this facet is used as the light emitting portion. This "facet" is such a notion that includes a slant face with respect to the principal plane of the semiconductor substrate.

In this fashion, the facet except {0001} plane to provide triaxial anisotropy may be provided on part of the growth substrate. A part of TS (Terraced Substrate) type semiconductor laser, for example, may be constituted by virtue of such facet.

The facet is likewise selected as a face perpendicular to {1 $\bar{1}$00} plane or {11 $\bar{2}$0} plane and then this perpendicular face may be used as the cleavage planes constituting the resonator.

In this case, if {1 $\bar{1}$00} plane or {11 $\bar{2}$0} plane perpendicular the facet is used as the cleavage plane, the resonator can be formed by two cleavage planes.

In turn, a structure of the optical semiconductor device described above and a method of manufacturing the same will be explained in detail hereinbelow.

FIRST EXAMPLE

A first example of the first embodiment of the present invention will be explained with reference to FIGS. 2A to 2C hereinbelow.

Figure 2A:
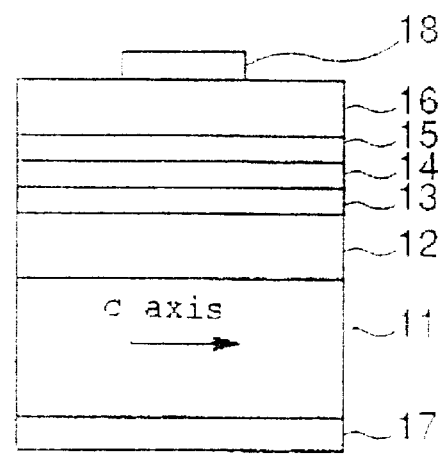
FIG. 2A is a schematic side view showing, if viewed from an optical output end, a layer structure according to a first example of a semiconductor laser employing the layer structure according to the first embodiment of the present invention.

First, as shown in FIG. 2A, an n type $A_{10.1}Ga_{0.9}N$ cladding layer 12 is formed in 100 to 5000 nm, preferably 2000 nm thick on an n type GaN (1 $\bar{1}$00) substrate 11 having (1 $\bar{1}$00) plane as a principal plane under the condition where a growth pressure is set in the range 70 to 760 Torr, for example, at 100 Torr, and a growth temperature is set in the range of 850 to 1100° C., for example, at 950° C. while flowing TMGa (trimethylgallium) at 10 to 100 μmol/min, for example, 45 μmol/min; TMAl (trimethylalminum) at 10 to 100 μmol/min, for example, 45 μmol/min; ammonia (NH$_3$) at 0.02 to 0.2 mol/min, for example, 0.1 mol/min; Si$_2$H$_6$ at 0.0001 to 0.002 μmol/min, for example, 0.0007 μmol/min; and hydrogen as a carrier gas at 300 to 3000 sccm, for example, 1000 sccm.

Next, an n type GaN light guide layer 13 is grown in 50 to 500 nm, preferably 100 nm thick under the condition where the growth pressure is set in the range 70 to 760 Torr, for example, at 100 Torr, and the growth temperature is set in the range of 850 to 1050° C., for example, at 930° C. while flowing TMGa at 10 to 100 μmol/min, for example, 45 μmol/min; ammonia at 0.02 to 0.2 mol/min, for example, 0.1 mol/min; Si$_2$H$_6$ at 0.0001 to 0.002 μmol/min, for example, 0.0007 μmol/min; and hydrogen as a carrier gas at 300 to 3000 sccm, for example, 1000 sccm.

Subsequently, a $Ga_{0.9}In_{0.1}N$ active layer 14 is grown in 1 to 20 nm, preferably 3 nm thick under the condition where the growth pressure is set in the range 70 to 760 Torr, for example, at 100 Torr, and the growth temperature is set in the range of 550 to 800° C., for example, at 650° C. while flowing TMGa at 2.5 to 25 μmol/min, for example, 10 μmol/min; TMIn (trimethylindium) at 25 to 250 μmol/min, for example, 100 μmol/min; ammonia at 0.02 to 0.2 mol/min, for example, 0.1 mol/min; and nitrogen as a carrier gas at 300 to 3000 sccm, for example, 1000 sccm.

In turn, a p type GaN light guide layer 15 is grown in 50 to 500 nm, preferably 100 nm thick under the condition where the growth pressure is set in the range 70 to 760 Torr, for example, at 100 Torr, and the growth temperature is set in the range of 800 to 1050° C., for example, at 930° C. while flowing TMGa at 10 to 100 μmol/min, for example, 45 μmol/min; ammonia at 0.02 to 0.2 mol/min, for example, 0.1 mol/min; biscyclopentadienylmagnesium at 0.01 to 0.5 mol/min, for example, 0.05 mol/min; and hydrogen as a carrier gas at 300 to 3000 sccm, for example, 1000 sccm.

In the next, a p type $A_{10.1}Ga_{0.9}N$ cladding layer 16 is grown in 100 to 2000 nm, preferably 500 nm thick under the condition where the growth pressure is set in the range 70 to 760 Torr, for example, at 100 Torr, and the growth temperature is set in the range of 800 to 1050° C., for example, at 930° C. while flowing TMGa at 10 to 100 μmol/min, for example, 45 μmol/min; TMAl at 10 to 100 μmol/min, for example, 45 μmol/min; ammonia at 0.02 to 0.2 mol/min, for example, 0.1 mol/min; biscyclopentadienylmagnesium at 0.01 to 0.5 μmol/min, for example, 0.05 μmol/min; and hydrogen as a carrier gas at 300 to 3000 sccm, for example, 1000 sccm.

In this case, a growth rate of the n type $A_{10.1}Ga_{0.9}N$ cladding layers 12, 16 is 0.6 to 5.5 μm/hour, typically 2.6 μm/hour; a growth rate of the GaN light guide layers 13, 15 is 0.5 to 5.2 μm/hour, typically 2.4 μm/hour; and a growth rate of the $Ga_{0.9}In_{0.1}N$ active layer 14 is 0.1 to 1.5 μm/hour, typically 0.6 μm/hour.

Then, a Ti/Au electrode 17 is provided as an n side electrode on a back surface of the n type GaN (1–100) substrate 11 while an Ni/Au electrode 18 is provided as a p side electrode on the p type $A_{10.1}Ga_{0.9}N$ cladding layer 16, then device isolation is executed, and a resonator is formed by cleaving the layers along (0001) face, thereby finishing the semiconductor laser.

In this case, since (0001) plane is perpendicular to (1 $\bar{1}$00) plane serving as the principal plane of the substrate, a pair of cleavage planes act as the resonator.

In the first example, since (1 $\bar{1}$00) plane is employed as the substrate, growth faces of the n type $A_{10.1}Ga_{0.9}N$ cladding layer 12 to the p type $A_{10.1}Ga_{0.9}N$ cladding layer 16 formed on the substrate become also (1 $\bar{1}$00) face. Thus the $Ga_{0.9}In_{0.1}N$ active layer 14 undergoes compressive stress in (1 $\bar{1}$00) plane due to difference in lattice constants between the n type GaN light guide layer 13 and the $Ga_{0.9}In_{0.1}$n active layer 14 to thus cause the triaxial anisotropy.

In other words, since in the first example an in-plane interatomic distance is defined by lattice constants 3.189 Å and 5.185 Å along a and c axes of the n type $A_{10.1}Ga_{0.9}N$ cladding layer 12, the $Ga_{0.9}In_{0.1}N$ active layer 14 which has lattice constants 3.225 Å and 5.243 Å along a and c axes undergoes compressive stress to thus exhibit triaxial anisotropy.

Energy bandgaps of $Ga_{0.9}In_{0.1}N$, GaN, and $A_{10.1}Ga_{0.9}N$ are 3.15 eV, 3.4 eV, and 3.7 eV respectively.

Figure 2B:
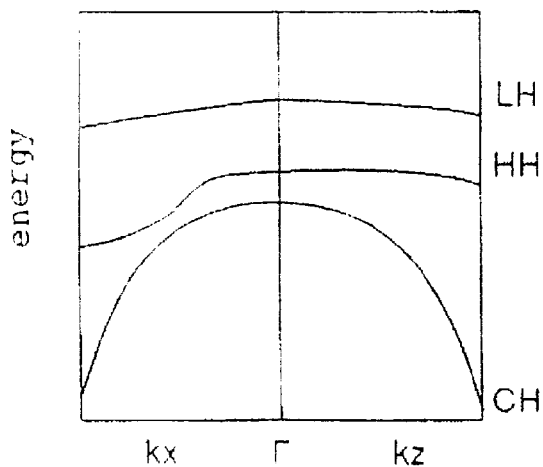
FIG. 2B is a band diagram showing an energy band structure of valence band of the active layer obtained by the layer structure in FIG. 2A.
Figure 2C:
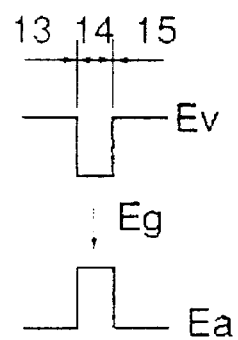
FIG. 2C is a sketch illustrative of a relative energy band structure of two cladding layers and the active layer.

As shown in FIG. 2B, in this case compressive stress in-plane is imposed on such GaN system semiconductor, degeneracy of HH and LH bands at an uppermost energy level is released and separated so that LH transfers to the uppermost energy level. As a result, laser oscillation is caused due to transition between LH and conduction band to thereby reduce threshold current density substantially.

In the first example, although the GaN (1 $\bar{1}$00) substrate 11 having (1 $\bar{1}$00) plane as the principal plane has been employed as the substrate, the GaN substrate having (11 $\bar{2}$0)

plane as the principal plane may be employed. Otherwise, an AlN substrate or an SiC substrate having (1 $\bar{1}$00) plane or (11 $\bar{2}$0) plane as the principal plane may be employed. In this case, this principal plane may include all faces which are equivalent to (1 $\bar{1}$00) plane or (11 $\bar{2}$0) plane crystallographically, which is true of following examples in the first embodiments similarly.

Still further, a substrate made of AlN, SiC, or the like other than GaN may be employed as the substrate on which the active layer and the cladding layers of the semiconductor laser are formed. For instance, the GaN substrate in the device structure shown in FIG. 2A may be replaced with the AlN substrate and then the same structure shown in FIG. 2A may be formed on the AlN substrate. In the case of the SiC substrate, the same structure shown in FIG. 2A may be formed on the n type SiC substrate via an n type AlN buffer layer having a thickness of 5 to 100 nm, e.g., 20 nm.

As shown in FIG. 3, if resistance of the AlN substrate 11a seems high, a structure may be utilized wherein an electrode 17a is connected to a part of the AlGaN cladding layer 12. Similarly this structure may be utilized if the AlN buffer layer is used. These structures may be adopted similarly in examples described later.

SECOND EXAMPLE

A second example of the first embodiment of the present invention will be explained with reference to FIG. 4 hereinbelow.

Figure 4A:
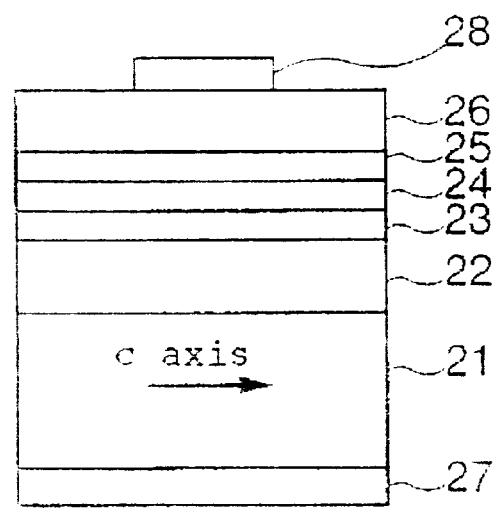
FIG. 4A is a schematic side view showing, if viewed from the optical output end, a layer structure according to a second example of a semiconductor laser employing the layer structure according to the first embodiment of the present invention.

First, as shown in FIG. 4A, an n type $Al_{0.4}Ga_{0.3}In_{0.3}N$ cladding layer 22 is formed in 100 to 5000 nm, preferably 2000 nm thick on an n type GaN (1 $\bar{1}$00) substrate 21 having (1 $\bar{1}$00) plane as a principal plane under the condition where a growth pressure is set in the range 70 to 760 Torr, for example, at 100 Torr, and a growth temperature is set in the range of 550 to 900° C., for example, at 700° C. while flowing TMGa at 2.5 to 25 µmol/min, for example, 10 µmol/min; TMAl at 30 to 300 µmol/min, for example, 150 µmol/min; TMIn at 250 to 2500 µmol/min, for example, 1000 µmol/min; ammonia at 0.02 to 0.2 mol/min, for example, 0.1 mol/min; $Si_2H_6$ at 0.0001 to 0.002 µmol/min, for example, 0.0007 µmol/min; and nitrogen as a carrier gas at 300 to 3000 sccm, for example, 1000 sccm.

Next, an n type $Al_{0.15}Ga_{0.65}In_{0.2}N$ light guide layer 23 is grown in 50 to 500 nm, preferably 100 nm thick under the condition where the growth pressure is set in the range 70 to 760 Torr, for example, at 100 Torr, and the growth temperature is set in the range of 550 to 900° C., for example, at 700° C. while flowing TMGa at 5 to 50 µmol/min, for example, 20 µmol/min; TMAl at 10 to 100 µmol/min, for example, 50 µmol/min; TMIn at 150 to 1500 µmol/min, for example, 660 µmol/min; ammonia at 0.02 to 0.2 mol/min, for example, 0.1 mol/min; $Si_2H_6$ at 0.0001 to 0.002 µmol/min, for example, 0.0007 µmol/min; and nitrogen as a carrier gas at 300 to 3000 sccm, for example, 1000 sccm.

Subsequently, a $Ga_{0.9}In_{0.1}N$ active layer 24 is grown in 1 to 20 nm, preferably 3 nm thick under the condition where the growth pressure is set in the range 70 to 760 Torr, for example, at 100 Torr, and the growth temperature is set in the range of 550 to 900° C., for example at 700° C. while flowing TMGa at 2.5 to 25 µmol/min, for example, 10 µmol/min; TMIn at 25 to 250 µmol/min, for example, 100 µmol/min; ammonia at 0.02 to 0.2 mol/min, for example, 0.1 mol/min; and nitrogen as a carrier gas at 300 to 3000 sccm, for example, 1000 sccm.

In turn, a p type $Al_{0.15}Ga_{0.65}In_{0.2}N$ light guide layer 25 is grown in 50 to 500 nm, preferably 100 nm thick under the condition where the growth pressure is set in the range 70 to 760 Torr, for example, at 100 Torr, and the growth temperature is set in the range of 550 to 900° C., for example, at 700° C. while flowing TMGa at 5 to 50 µmol/min, for example, 20 µmol/min; TMAl at 10 to 100 µmol/min, for example, 50 µmol/min; TMIn at 150 to 1500 µmol/min, for example, 660 µmol/min; ammonia at 0.02 to 0.2 mol/min, for example, 0.1 mol/min; biscyclopentadienylmagnesium at 0.01 to 0.5 µmol/min, for example, 0.05 µmol/min; and nitrogen as a carrier gas at 300 to 3000 sccm, for example, 1000 sccm.

In the next, a p type $Al_{0.4}Ga_{0.3}In_{0.3}N$ cladding layer 26 is grown in 100 to 2000 nm, preferably 500 nm thick under the condition where the growth pressure is set in the range 70 to 760 Torr, for example, at 100 Torr, and the growth temperature is set in the range of 550 to 900° C., for example, at 700° C. while flowing TMGa at 2.5 to 25 µmol/min, for example, 10 µmol/min; TMAl at 30 to 300 µmol/min, for example, 150 µmol/min; TMIn at 250 to 2500 µmol/min, for example, 1000 µmol/min; ammonia at 0.02 to 0.2 mol/min, for example, 0.1 mol/min; biscyclopentadienylmagnesium at 0.01 to 0.5 µmol/min, for example, 0.05 µmol/min; and nitrogen as a carrier gas at 300 to 3000 sccm, for example, 1000 sccm.

In this case, a growth rate of the $Al_{0.4}Ga_{0.3}In_{0.3}N$ cladding layers 22, 26 is 0.2 to 3.0 µm/hour, typically 1.2 µm/hour; a growth rate of the $Al_{0.15}Ga_{0.65}In_{0.2}N$ light guide layers 23, 25 is 0.3 to 5.0 µm/hour, typically 1.8 µm/hour; and a growth rate of the $Ga_{0.9}In_{0.1}N$ active layer 24 is 0.1 to 1.5 µm/hour, typically 0.6 µm/hour.

Succeedingly, a Ti/Au electrode 27 is provided as an n side electrode on a back surface of the n type GaN substrate 21 having (1 $\bar{1}$00) plane as a surface, while an Ni/Au electrode 28 is provided as a p side electrode on the p type $Al_{0.4}Ga_{0.3}In_{0.3}N$ cladding layer 26. Then, device isolation is implemented, and a resonator is formed by cleaving the layers along (0001) face, thereby completing the semiconductor laser.

In the second example, since (1 $\bar{1}$00) plane is employed as the substrate, (1 $\bar{1}$00) plane is also derived as growth faces of the n type $Al_{0.4}Ga_{0.3}In_{0.3}N$ cladding layer 22 to the p type $Al_{0.4}Ga_{0.3}Ino_{·3}N$ cladding layer 26 formed on the substrate. Thus the $Ga_{0.9}In_{0.1}N$ active layer 24 undergoes compressive stress to thus cause the triaxial anisotropy.

In other words, since an in-plane interatomic distance is defined by lattice constants 3.266 Å and 5.276 Å along a and c axes of the n type $Al_{0.4}Ga_{0.3}In_{0.3}N$ cladding layer 22 in the second example, tensile stress is imposed on the $Ga_{0.9}In_{0.1}N$ active layer 24 which has lattice constants 3.225 Å and 5.243 Å along a and c axes so that triaxial anisotropy is caused.

Respective energy bandgaps of $Ga_{0.9}In_{0.1}N$, $Al_{0.15}Ga_{0.65}In_{0.2}n$, and $Al_{0.4}Ga_{0.3}In_{0.3}N$ are 3.15 eV, 3.4 eV, and 3.6 eV.

Figure 4B:
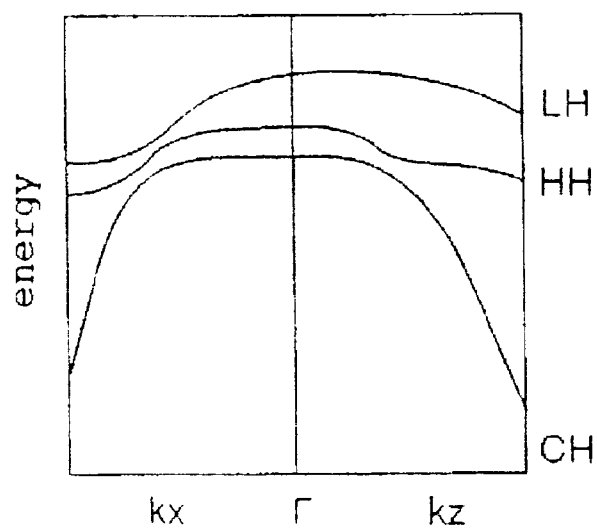
FIG. 4B is a band diagram showing an energy band structure of valence band of the active layer obtained by the layer structure in FIG. 4A.

As shown in FIG. 4B, in case tensile stress is applied to such GaN system semiconductor, degeneracy of HH and LH bands at an uppermost energy level is released and separated, so that LH shifts to the uppermost energy level and larger difference in energy between LH and HH can be achieved. Therefore, threshold current density can be reduced much more.

In this manner, as for reduction in threshold current density, the band structure in FIG. 4B using biaxial in-plane tensile stress is preferable rather than the band structure in FIG. 2B using biaxial in-plane compressive stress because difference in energy between the uppermost band and the second uppermost band can be made larger and LH can be top-band. However, compressive stress is desired with respect to device lifetime because it is highly likely that cracks are generated by tensile stress in the active layer.

In the second example, if the AlN substrate is employed, the GaN substrate in the device structure shown in FIG. 4A may be replaced with the AlN substrate and then the same structure shown in FIG. 4A may be formed on the AlN substrate. In the case of the SiC substrate, the same structure shown in FIG. 4A may be formed on the n type SiC substrate via an AlN buffer layer having a thickness of 5 to 100 nm, e.g., 20 nm.

THIRD EXAMPLE

Figure 5A:
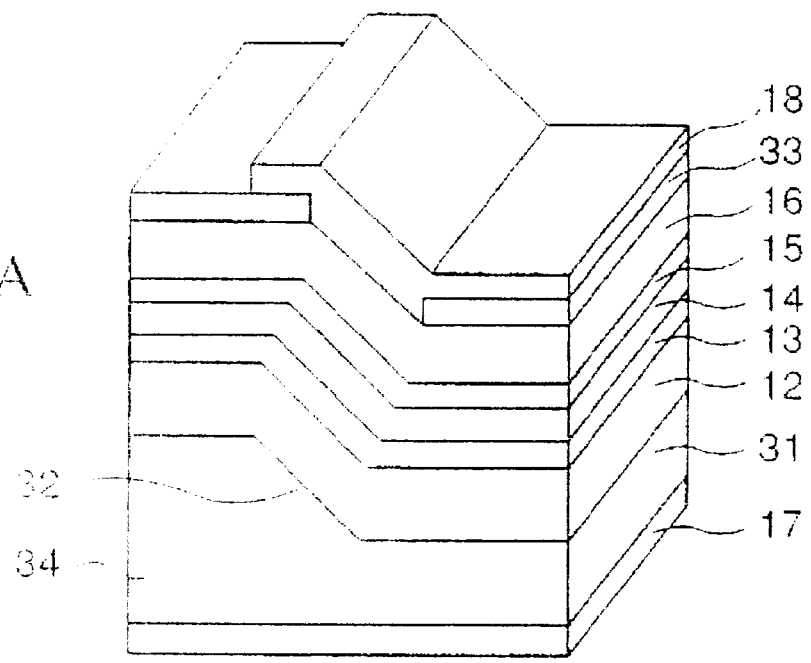
FIG. 5A is a perspective side view showing a layer structure according to a third example of a semiconductor laser employing the layer structure according to the first embodiment of the present invention.
Figure 5B:
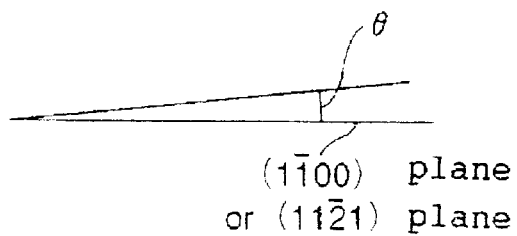
FIG. 5B is a sketch illustrative of an inclination angle of a facet with the principal plane of the substrate used in the semiconductor laser in FIG. 5A.

A third example of the first embodiment of the present invention will be explained with reference to FIGS. 5A and 5B hereinbelow, but only a structure thereof will be explained because manufacturing conditions are completely similar to those in the first example.

A device shown in perspective view of FIG. 5 is a so-called TS semiconductor laser. An n type GaN (0001) substrate 31 wherein (11 $\overline{2}$0) facet 32 formed of (11 $\overline{2}$1) plane is provided on a stepped portion of the GaN substrate using (0001) plane as the principal plane is utilized as a growth substrate.

Like the first example, the n type $A_{10.1}Ga_{0.9}N$ cladding layer 12, the n type GaN light guide layer 13, the $Ga_{0.9}In_{0.1}N$ active layer 14, the p type GaN light guide layer 15 and the p type $A_{10.1}Ga_{0.9}N$ cladding layer 16 are formed in sequence on the n type GaN (0001) substrate 31.

Next, the Ti/Au electrode 17 is provided as the n side electrode, while the Ni/Au electrode 18 is provided as the p side electrode via an opening formed in an insulating film 33 such as $SiO_2$. Then, the TS semiconductor laser having a pair of (1 $\overline{1}$00) cleavage planes 34 as a resonator can be accomplished by cleaving the layers along (1 $\overline{1}$00) plane after device isolation is effected appropriately.

In this event, though the principal plane of the substrate is (0001) plane perpendicular to the c axis, a face being parallel with (11 $\overline{2}$1) plane may serve actually as the light emitting portion, i.e., laser oscillation portion. Since compressive stress applied in (11 $\overline{2}$1) plane causes triaxial anisotropy to thus release degeneracy like in FIG. 2B, threshold current density is lowered. However, since stress is imposed on (11 $\overline{2}$1) facet 32, influence of stress can be made smaller than the first example so that reduction in threshold current density is inferior to the first example.

The facet is not limited to (11 $\overline{2}$1) facet 32 in this case.

In this third example, the substrate is not limited to GaN or $LiAlO_3$, AlN or SiC may be employed. Modification of the structure following to change of substrate material may be conducted similarly to the replacement in the first example. In addition, if a semiconductor with the same composition as the second example is employed, tensile stress is imposed on the active layer, like the second example.

FOURTH EXAMPLE

Although the explanation has been made using the binary compound substrate as the substrate in the first to third examples, a mixed crystal substrate such as $A_{10.1}Ga_{0.9}N$ or $Al_{0.4}Ga_{0.3}In_{0.3}N$ may be used. In this event, since lattice mismatching between the $A_{10.1}Ga_{0.9}N$ cladding layer or the $Al_{0.4}Ga_{0.3}In_{0.3}N$ cladding layer and such mixed crystal substrate can be eliminated completely, crystal quality of the growth layers is in no terms damaged.

Figure 6A:
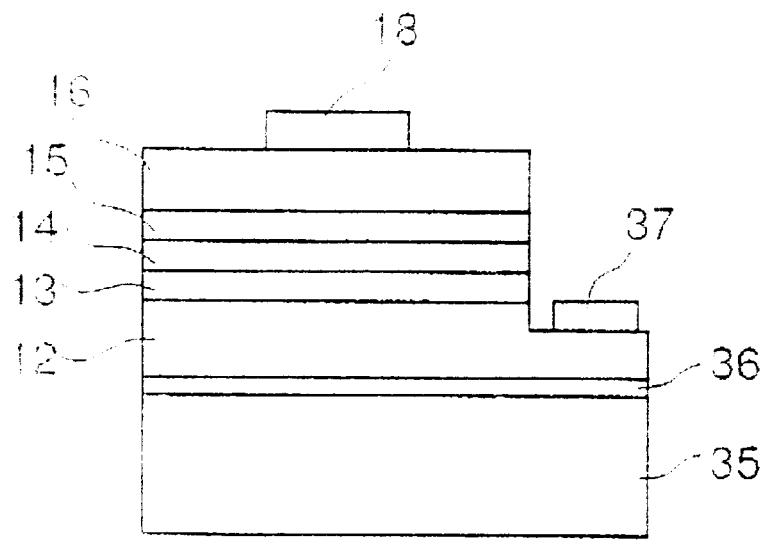
FIG. 6A is a schematic side view showing, if viewed from the optical output end, a layer structure according to a fourth example of a semiconductor laser employing the layer structure according to the first embodiment of the present invention.

As shown in FIG. 6A, an $LiAlO_2$ substrate 35 having tetragonal crystal may be used as other substrates used in the semiconductor laser. Such example will be explained in the following. Incidentally, $LiAlO_2$ is called lithium aluminate.

Therefore, steps of manufacturing the semiconductor laser using the $LiAlO_2$ substrate 35 will be explained hereinbelow.

Either {100} plane or face inclined at a predetermined angle, e.g., in the range of ±5°, with {100} plane should be used as the principal plane of the $LiAlO_2$ substrate 35.

First, with the use of organic cleaner such as isopropyl alcohol or ethyl alcohol, a surface of the $LiAlO_2$ substrate 35 is cleaned.

The $LiAlO_2$ substrate 35 is then loaded on the suscepter in the growth furnace of the metal organic chemical vapor deposition equipment. Then, while replacing atmospheric gas of the $LiAlO_2$ substrate 35 with nitrogen, atmospheric pressure is lowered up to 100 Torr.

Subsequently, thermal cleaning is conducted by heating the $LiAlO_2$ substrate 35 at a temperature higher than a growth temperature described later by 50° to thus sublimate elements from a surface of the $LiAlO_2$ substrate 35.

The $LiAlO_2$ substrate 35 is lowered up to the growth temperature of 800 to 1050° C., for example, and TMGa gas, ammonia gas, and $Si_2H_6$ gas are introduced into growth atmosphere. TMGa is changed into a gas state by virtue of bubbling using nitrogen gas in the thermostat. The nitrogen gas is used as the carrier gas. Si element of $Si_2H_6$ functions as n type dopant.

A flow rate of the TMGa gas is set in the range of 10 to 100 $\mu$mol/min. A flow rate of the ammonia gas is set in the range of 2×104 to 2×105 $\mu$mol/min. In addition, a flow rate of the nitrogen gas is set in the range of 0.3 to 3.0 $\mu$mol/min.

In this event, if the flow rate of the TMGa gas is set to 45 $\mu$mol/min, the flow rate of the ammonia gas is set to 1×105 $\mu$mol/min, the flow rate of the nitrogen gas is set to 1.0 $\mu$mol/min, and the growth temperature is set to 930° C., growth rate of GaN on the $LiAlO_2$ substrate 35 is 2.4 $\mu$m/h. According to conditions achieved in the range of the above gas flow rates and the growth temperature, growth rate of GaN is 0.5 to 5.2 $\mu$m/h.

An n type GaN buffer layer 36 of 5 to 100 nm thickness, for example, may be grown on the $LiAlO_2$ substrate 35 according to such conditions.

Subsequently, in the same condition as in the first example, the n type $A_{10.1}Ga_{0.9}N$ cladding layer 12, the n type GaN light guide layer 13, the $Ga_{0.9}In_{0.1}N$ active layer 14, the p type GaN light guide layer 15, and the p type $A_{10.1}Ga_{0.9}N$ cladding layer 16 are formed in order. Magnesium (Mg) may be used as p type dopant.

Conditions for forming these layers, thicknesses of the layers, material gases are selected similarly to the first example.

Next, after the $LiAlO_2$ substrate 35 is taken out of the growth furnace, part of the n type $A_{10.1}Ga_{0.9}N$ cladding layer 12 is exposed. Then a Ti/Au electrode 37 is provided on the part of the n type $A_{10.1}Ga_{0.9}N$ cladding layer 12 as the n side electrode, while the Ni/Au electrode 18 is provided on the p type $A_{10.1}Ga_{0.9}N$ cladding layer 16 as the p side electrode. Then, the semiconductor laser can be accomplished by device-isolating the $LiAlO_2$ substrate 35, the n type GaN buffer layer 36, the layers 12 to 16, and the electrodes appropriately.

Figure 7:
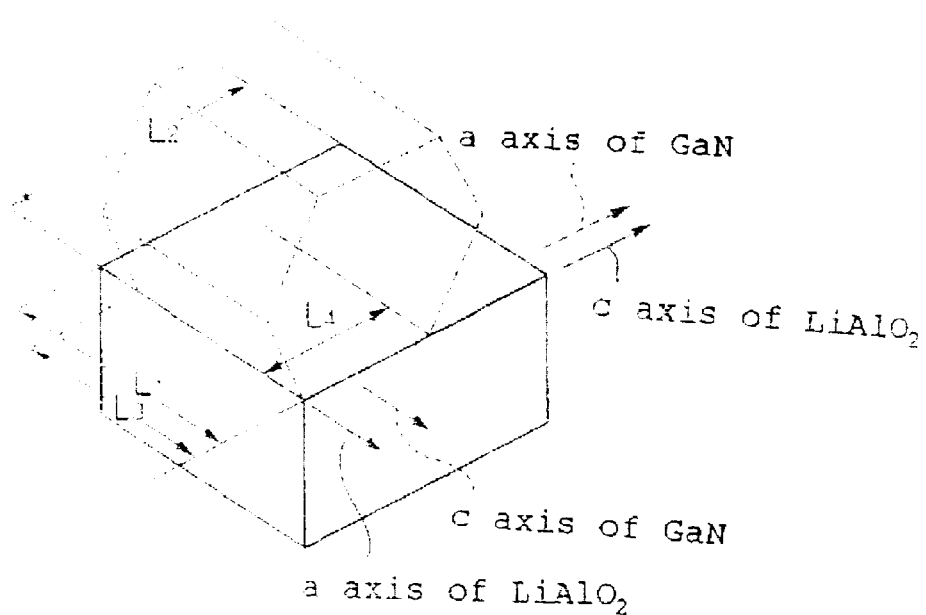
FIG. 7 is a perspective view showing relative relationships between special form of holohedral form of respective crystals if a hexagonal crystal semiconductor layer is formed on a principal plane of a tetragonal crystal substrate having c axis in parallel with the principal plane in the first embodiment of the present invention.

As shown in FIG. 7, if hexagonal GaN is grown on {100} plane of the tetragonal $LiAlO_2$ substrate 35, the a axis of $LiAlO_2$ is in parallel with the c axis of GaN and the c axis of $LiAlO_2$ is in parallel with the a axis of GaN.

As a result, since GaN is grown on {100} plane of the $LiAlO_2$ substrate 35 so as to direct (1 $\bar{1}$00) plane upwardly, a face underlying the n type $Al_{0.1}Ga_{0.9}N$ cladding layer 12 is (1 $\bar{1}$00) plane of the GaN layer 36.

Therefore, like the first example, growth faces of the n type $Al_{0.1}Ga_{0.9}N$ cladding layer 12, the n type GaN light guide layer 13, the $Ga_{0.9}In_{0.1}N$ active layer 14, the p type GaN light guide layer 15, and the p type $Al_{0.1}Ga_{0.9}N$ cladding layer 16 are (1 $\bar{1}$00) faces. Since the $Ga_{0.9}In_{0.1}N$ active layer 14 undergoes compressive stress in (1 $\bar{1}$00) plane due to difference in lattice constants between the n type GaN light guide layer 13 and the $Ga_{0.9}In_{0.1}N$ active layer 14, like the first example, triaxial anisotropy appears.

Furthermore, as shown in FIG. 7, an interatomic distance L1 along the a axis direction of the tetragonal $LiAlO_2$ is 5.1687 Å, an interatomic distance L2 along the c axis direction of the tetragonal $LiAlO_2$ is 6.2679 Å, an interatomic distance L3 along the a axis direction of the hexagonal GaN is 3.189 Å, and an interatomic distance L4 along the c axis direction of the hexagonal GaN is 5.185 Å.

Hence, taking into account of respective interatomic distances, the a axis direction, and the c axis direction, lattice mismatching between the GaN buffer layer and the $LiAlO_2$ substrate will be discussed in the following.

The lattice mismatching between the GaN buffer layer 36 and the $LiAlO_2$ substrate 35 along the c axis direction of the GaN buffer layer 36 is small, as given by $$(c_{GaN} - a_{LiAlO\ 2})/c_{LiAlO\ 2} = 1.8 \times 10^{-3} \quad (2)$$

Where aGaN is the interatomic distance of GaN along the a axis, and $cLiAlO_2$ is the interatomic distance of $LiAlO_2$ along the c axis.

In this fashion, in the event that the lattice mismatching between the GaN buffer layer 36 and the $LiAlO_2$ substrate 35 are small, cracks due to thermal expansion are hard to be generated in the GaN buffer layer 36 if either {100} plane or face inclined by an angle of 0 to 5° with {100} plane is set as the principal plane of the $LiAlO_2$ substrate 35 and then the GaN buffer layer 36 is formed on the principal plane.

In this case, the c axis of the GaN buffer layer 36 is inclined by an angle of 0 to 5° with the principal plane of the $LiAlO_2$ substrate 35 and thus distortion is imposed on a face being not perpendicular to the c axis in the GaN buffer layer 36. As a result, distortion applied to the GaN buffer layer 36 exhibits triaxial anisotropy so that double degeneracies of HH and LH in valence band of the energy band structure can be released to then reduce threshold current density of the semiconductor laser.

Figure 8:
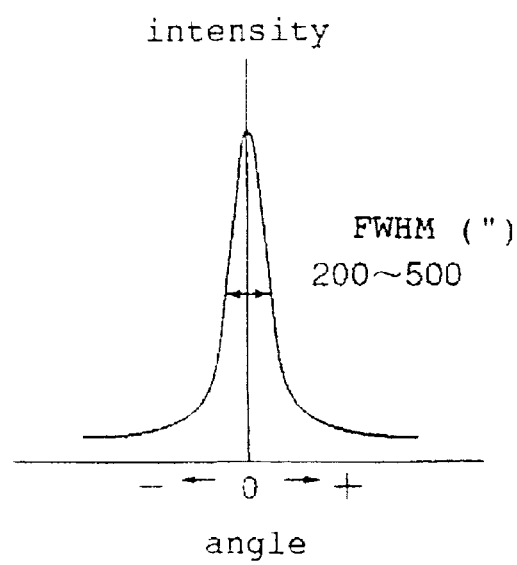
FIG. 8 is a view showing an X-ray diffraction locking curve of the hexagonal crystal semiconductor layer formed on the tetragonal crystal substrate in the first embodiment of the present invention.

The film having excellent crystal quality like 200 to 500 (") in terms of FWHM (Full Width Half Maximum), as shown in FIG. 8, can be obtained if a locking curve for distribution of X-ray diffraction intensity in the single crystal GaN layer which is grown to have (1 $\bar{1}$00) plane has been measured.

Figure 6B:
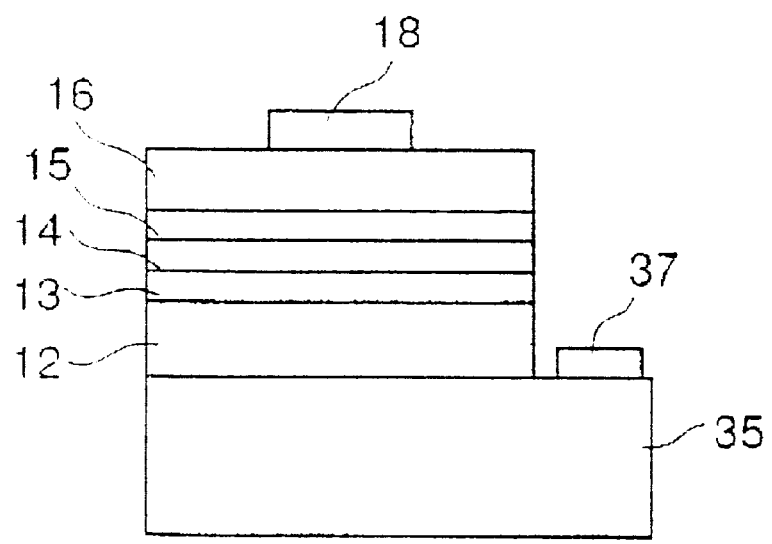
FIG. 6B is a side view showing a layer structure achieved if a substrate is made of highly resistive material in the fourth example when a semiconductor laser is viewed from the optical output end.

With the above description, though the case has been explained where the GaN film is formed on the $LiAlO_2$ substrate 35, a similar crystal structure will be attained, as shown in FIG. 6B, if $Al_xGa_{1-x-y}In_yN$ layer should be directly formed on the $LiAlO_2$ substrate 35. In other words, either {100} plane or face inclined at 0 or 0 to 5° with {100} plane may be selected as the principal plane of the $LiAlO_2$ substrate 35; then the n type $Al_{0.1}Ga_{0.9}N$ cladding layer 12, the n type GaN light guide layer 13, the $Ga_{0.9}In_{0.1}N$ active layer 14, the p type GaN light guide layer 15, and the p type $Al_{0.1}Ga_{0.9}N$ cladding layer 16 are formed in sequence; whereby the semiconductor laser may be constituted by these layers. In this case, growth conditions, film thicknesses, etc. may be selected in a similar manner in the second example.

In the meanwhile, the interatomic distance La1 along the a axis direction of $Al_xGa_{1-x-y}In_yN$ ($0 \leq x \leq 1$, $0 \leq y \leq 1$) is expressed by following Eq. (3), the interatomic distance La2 along the c axis direction of $LiAlO_2$ is expressed by following Eq. (4), and the a axis direction of $Al_xGa_{1-x-y}In_yN$ is parallel with the c axis direction of GaN. Further, the interatomic distance Lc1 along the c axis direction of $Al_xGa_{1-x-y}In_yN$ is expressed by following Eq. (5), the interatomic distance Lc2 along the c axis direction of GaN is expressed by following Eq. (6), and the c axis direction of $Al_xGa_{1-x-y}In_yN$ is parallel with the a axis direction of $LiAlO_2$.

$$La_1 = xa_{AlN} + a_{GaN} - xa_{GaN} - ya_{GaN} + ya_{InN} \quad (3)$$

$$La_2 = c_{LiAlO\ 2} \quad (4)$$

$$Lc_1 = x\ c_{AlN} + c_{GaN} - xc_{GaN} - yc_{GaN} + yc_{InN} \quad (5)$$

$$Lc_2 = a_{LiAlO\ 2} \quad (6)$$

Where $a_{AlN}$ is an interatomic distance along the a axis direction of AlN, $a_{GaN}$ is an interatomic distance along the a axis direction of GaN, $a_{InN}$ is an interatomic distance along the a axis direction of InN, $c_{LiAlO2}$ is an interatomic distance along the c axis direction of $LiAlO_2$, $c_{AlN}$ is an interatomic distance along the c axis direction of AlN, $c_{GaN}$ is an interatomic distance along the c axis direction of GaN, $c_{InN}$ is an interatomic distance along the c axis direction of InN, and $a_{LiAlO2}$ is an interatomic distance along the a axis direction of $LiAlO_2$.

Figure 9:
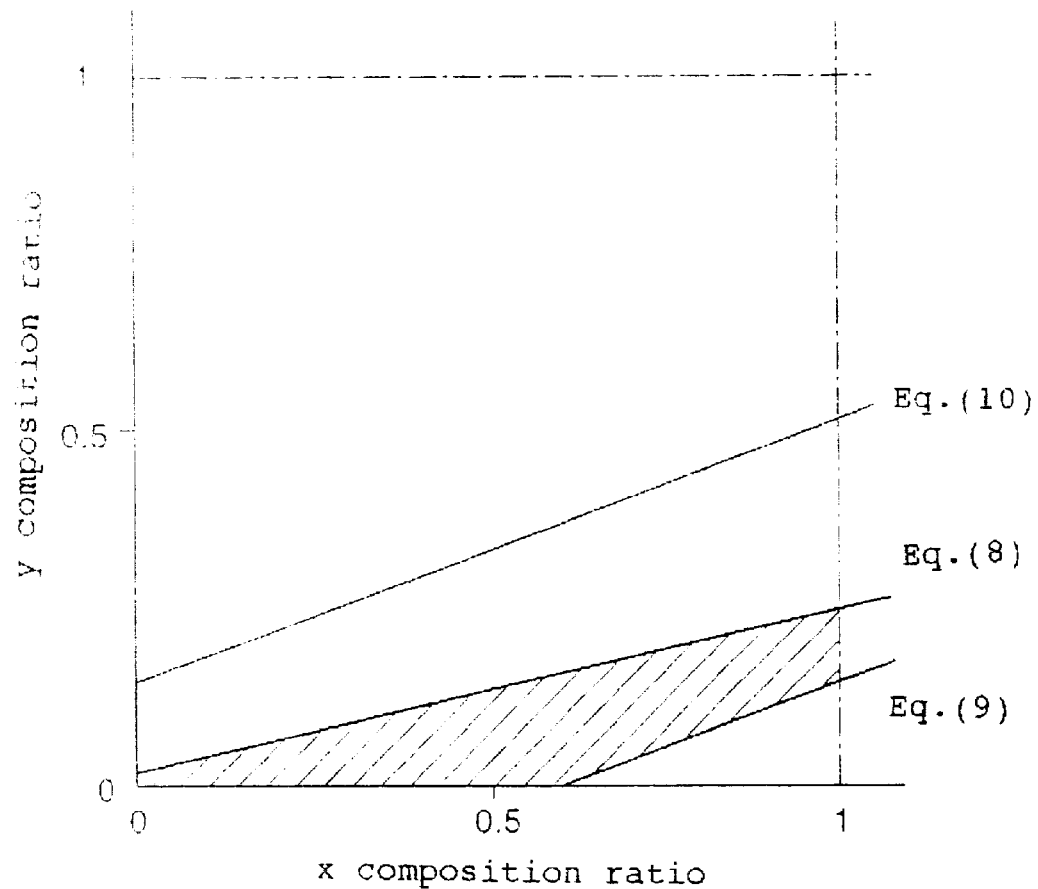
FIG. 9 is an x-y coordinate system showing a relation between a composition ratio x and a composition ratio y if the hexagonal $Al_xGa_{1-x-y}In_yN$ semiconductor layer is grown on the tetragonal $LiAlO_2$ substrate.

For composition ratios x, y of $Al_xGa_{1-x-y}In_yN$, if Eqs. (7) to (10) are formulated to provide lattice mismatching of 2×10-2% and are then plotted in the x-y coordinate system, the x-y area satisfying the conditions defined by Eqs. (7) to (10) can be given by the shaded area in FIG. 9. Therefore, if x, y composition ratios in the shaded area are selected, good crystal quality can be obtained and generation of cracks due to thermal expansion, etc. become hard in the crystal. Eq. (7) is not plotted in FIG. 9 since the y value is negative for $x \leq 1$.

$$y > \frac{a_{GaN} - a_{AlN}}{a_{InN} - a_{GaN}}x + \frac{0.98c_{LiAlO_2}/2 - a_{GaN}}{a_{InN} - a_{GaN}} \quad (7)$$
$$\cong 0.214\ x - 0.328$$

$$y < \frac{a_{GaN} - a_{AlN}}{a_{InN} - a_{GaN}}x + \frac{1.02c_{LiAlO_2}/2 - a_{GaN}}{a_{InN} - a_{GaN}} \quad (8)$$
$$\cong 0.214\ x + 0.021$$

$$y > \frac{c_{GaN} - c_{AlN}}{c_{InN} - c_{GaN}}x + \frac{0.98a_{LiAlO_2} - c_{GaN}}{c_{InN} - c_{GaN}} \cong 0.353\ x - 0.209 \quad (9)$$

$$y > \frac{c_{GaN} - c_{AlN}}{c_{InN} - c_{GaN}}x + \frac{1.02a_{LiAlO_2} - c_{GaN}}{c_{InN} - c_{GaN}} \cong 0.353\ x - 0.150 \quad (10)$$

OTHER EXAMPLE

In the first to third examples, although a just face such as (1 $\bar{1}$00) plane, (11 $\bar{2}$1) plane, or the like has been used as the principal plane of the substrate, a substrate in which (1 $\bar{1}$00) plane or (11 $\bar{2}$1) plane is inclined at an off angle θ ($0° \leq θ \leq 10°$) may be used to suppress twin, etc.

Moreover, although $Ga_{0.9}In_{0.1}N$ has been used as the active layer in the above examples, a mixed crystal ratio may be modified in the range of $Al_xGa_{1-x-y}In_yn$ ($0 \leq x \leq 1$, $0 \leq y \leq 1$) according to a wavelength required. Correspondingly, mixed crystal ratios of the light guide layer and the cladding layer may be modified in the range of AlaGa1-a-bInbN ($0 \leq a \leq 1$, $0 \leq b \leq 1$).

The light guide layers used in the above examples are not always needed and therefore hetero junction may be directly formed between the cladding layer and the active layer. In addition, the light guide layers and the cladding layers are not necessarily formed vertically symmetrically and therefore AlaGa1-a-bInbNs having different mixed crystal ratios may be used.

Materials in the above examples are not limited to the materials described above. Ethyl system, e.g., TEGa (triethylgallium), TEAl (Triethylaluminum), and TEIn (triethylindium) may be used in place of methyl system as organic metal material. Further, $N_2H_4$, $(CH_3)_3CNH_2$, $C_2H_5N_3$, or $CH_3NH.NH_2$ may be used in place of ammonia as nitrogen (N) source.

Furthermore, $SiH_4$ or $CH_3SiH_3$ may be used in place of $Si_2H_6$ as n type impurity. Also, $(CH_3C_5H_4)_2Mg$, $(C_5H_5C_5H_4)_2Mg$, $(i-C_3H_7C_5H_4)_2Mg$, or $(n-C_3H_7C_5H_4)_2$ may be used in place of biscyclopentadienylmagnesium $[(C_5H_5)_2Mg]$ as p type impurity.

SECOND EMBODIMENT

Figure 10:
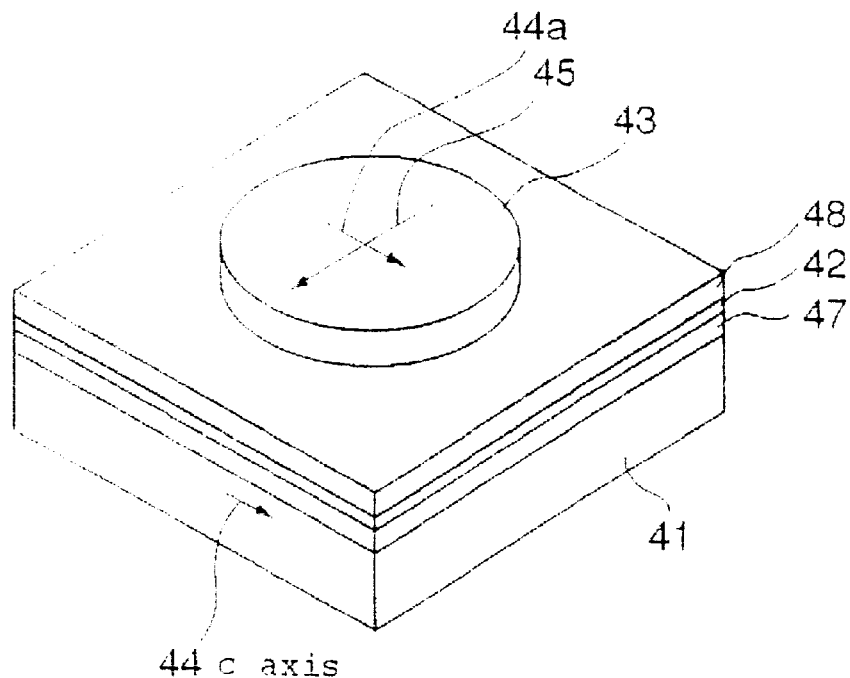
FIG. 10 is a perspective view showing a layer structure, except for electrodes, of a surface emitting type semiconductor laser according to a second embodiment of the present invention.
Figure 11:
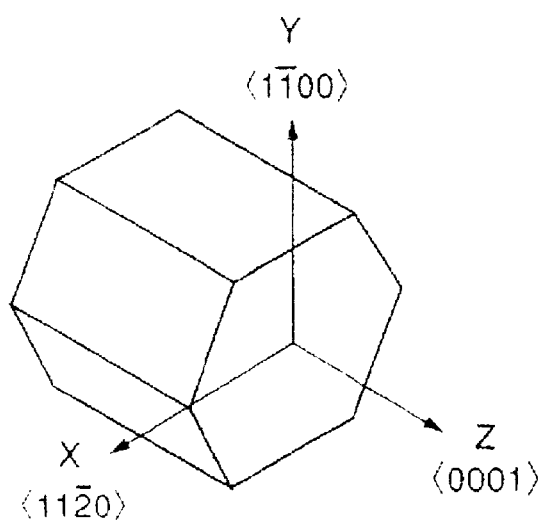
FIG. 11 is a perspective view showing special form of holohedral form of respective crystals in the active layer of the surface emitting type semiconductor laser according to the second embodiment of the present invention.

FIG. 10 is a perspective view showing a basic structure of a surface emitting type semiconductor laser according to a second embodiment of the present invention. FIG. 11 is a perspective view showing crystal orientations of the active layer of the second embodiment and showing relationships between crystal orientations of the active layer of the surface emitting type semiconductor laser in FIG. 10 and the coordinate axes.

In the first structure of the present invention, as shown in FIG. 10, an active layer 42 formed on a substrate 41 consists of hexagonal semiconductor layer having c axis along its faces. In other words, as shown in FIGS. 10 and 11, assuming that the xz plane is set in the principal plane of the active layer 42 and the y axis is set in a direction perpendicular to the active layer 42, c axis of hexagonal semiconductor crystal constituting the active layer 42, i.e., <0001> orientation, is arragned to direct to two axes in the face of the active layer 42.

If c axis is set to be included in the face of the active layer 42, polarozation plane of the oscillated light is defined, as will be described later. Though crystal orientations along x and y directions are not particularly limited, <11$\bar{2}$0> orientation may be selected as the x axis which lies on the face of the active layer 42 and also <1$\bar{1}$00> orientation may be selected as the y axis which lies along a film thickness direction of the active layer 42, for example.

The reason why the polarozation plane of the oscillated light is defined in the second embodiment will be explained hereinbelow.

Figure 12:
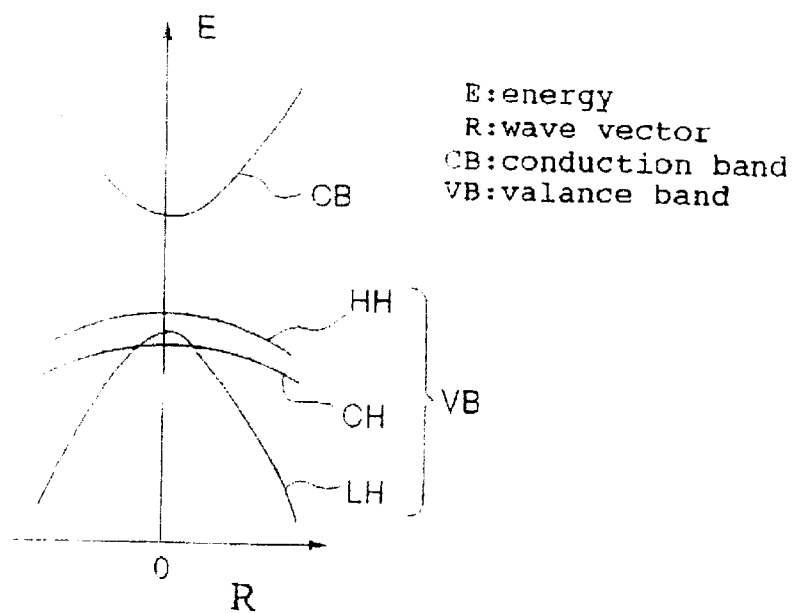
FIG. 12 is a band diagram showing an energy band structure of the active layer of the surface emitting type semiconductor laser according to the second embodiment of the present invention.

At first, the case will be explained where no distortion occurs in the active layer. FIG.12 is a band diagram showing energy band structure of GaN and showing the energy band structure of hexagonal semiconductor. As shown in FIG.12, valence band VB of GaN lies near the wave vector k=0 of electron and three bands HH, CH and LH lie near the bottom of the forbidden band.

Now, it is assumed that, if no distortion is caused in GaN, highest energy bad, second highest energy bad, and lowest energy band in the valence band are set as HH, LH, and CH bands in the wave vector k=0 respectively. With the use of two p orbital functions px and py which have polarization perpendicular to the c axis and an orbital functions pz which has polarization along the c axis under the condition where the c axis direction of crystal is set along Z axis of the XYZ three axes orthogonal coordinates, these HH, LH, and CH bands can be expressed by HH band; $(px+py)/\sqrt{2}$ LH band; $(px-py)/\sqrt{2}$ CH band; pz Since the HH band is most close to the bottom of the forbidden band, light generation transition to the HH band occurs preferentially in spontaneous emission from the conduction band CB to the valence band VB. The HH band is formed of coupling of p orbits and is symmetrical around the c axis. Therefore, light generation following spontaneous emission of GaN includes a polarization state wherein electric field oscillates perpendicularly to the c axis. Transition probability that polarization occurs is identical around the c axis of oscillation orientation. The description about to GaN has been made in the above, but the same is true of hexagonal semiconductor crystal. Since the zincblende semiconductor crystal is a cubically isotropic crystal, optical properties are isotropic.

Figure 26:
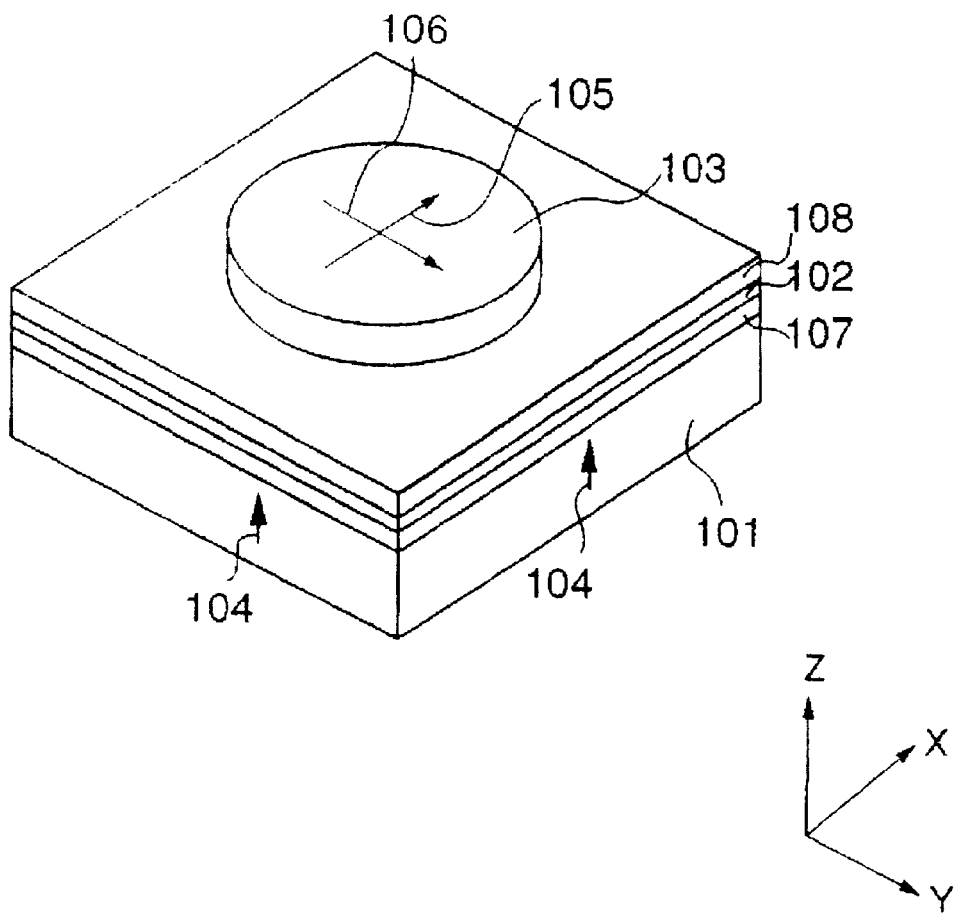
FIG. 26 is a perspective view showing a surface emitting type semiconductor laser in the prior art.

In the surface emitting type semiconductor laser having the conventional vertical resonator, since the active layer 102 is formed in perpendicular to the c axis 44, as shown in FIG.26, an oscillated light travels along the c axis 104. Therefore, polarozation plane of the oscillated light become the c plane 104 so that electric field oscillates perpendicularly to the c axis 104. As a result, because of symmetry of polarization of spontaneous emission around the c axis, oscillation lights occur equally in any direction in the KY plane. Accordingly, polarozation plane of the oscillation light is not fixed so that oscillation becomes unstable.

On the other hand, in the second embodiment, as shown in FIG.10, because the active layer 42 has the c axis in the face, a travelling direction of the oscillation light is perpendicular to the c axis. As has already been described when HH is in band edge, since the oscillation direction of the electric field of the spontaneous emission is perpendicular to the c axis, the oscillation direction of the electric field of the oscillation light is defined uniquely in a direction perpendicular to both the c axis direction and the travelling direction of theoscillation light, i.e., in a direction which is includedin the plane of the active layer and perpendicular to the c axis.

Therefore, in the surface emitting type semiconductor laser having this structure, an electric field direction of the oscillation light which travels in perpendicular to the active layer can be fixed in the direction perpendicular to the c axis. In the face emitting semiconductor laser, as a resonator is in the film thickness direction, the polarozation direction of light needs to be in the in-plane of the active layer. The light polarization plane is equal the direction of the electric field vector in light emitting. Namely, the polarization of top band which determines the direction of the electric field vector in light emitting needs to be in the in-plane of the active layer.

Figure 13:
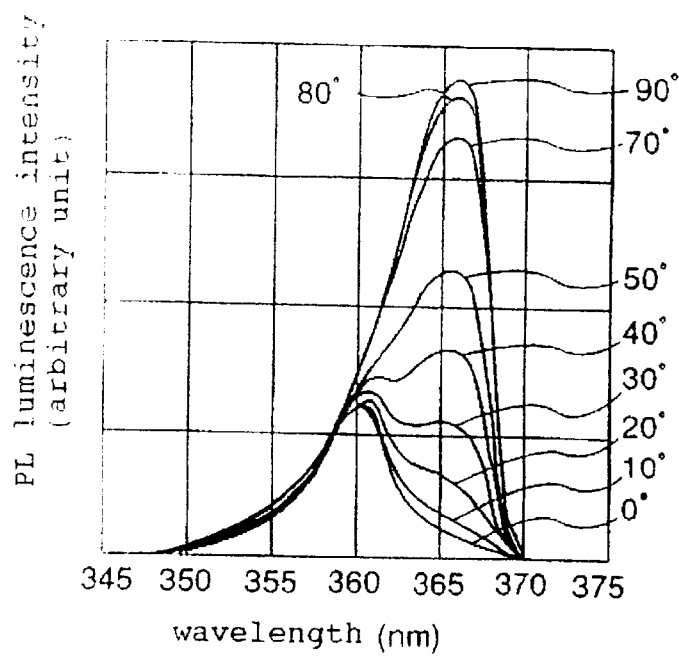
FIG. 13 is a characteristic view relationships between wavelength and PL luminescence intensity in accordance with calculation with the use of an angle between polarozation plane orientation in the active layer and c axis as a parameter in the surface emitting type semiconductor laser according to the second embodiment of the present invention.

Next, a PL (photo luminescence) wavelength and an polarozation plane orientation of the active layer will be explained hereinbelow. FIG.13 is a view showing PL characteristics of the active layer of the present invention when HH is in the top band and represents various calculation values of PL intensity in the active layer which is formed a GaN thin film used in the semiconductor laser having the first structure and having the c axis in the face. A parameter used in FIG.13 is orientation of the polarozation plane of the PL light, i.e., an angle θ between the oscillation direction of the electric field in the surface of the active layer and the c axis. Following descriptions are not limited to GaN, but may be applied similarly to hexagonal semiconductor crystal.

As shown in FIG.13, when the polarozation plane of the PL light intersects orthogonally with the c axis (indicated by 90° in FIG.13), PL spectral intensity of the active layer is maximized if the PL light of the active layer is analyzed with respect to the polarization plane, i.e., polarozation plane of the electric field, and the wavelength. A wavelength for this maximum intensity is about 366 nm and, as shown in FIG.12, this wavelength corresponds to light generation caused by transition from the conduction band CB to the HH band the valence band VB. On the contrary, when the polarozation plane of the PL light is parallel with the c axis (indicated by 0° in FIG.13), luminescence intensity is small and also a maximal wavelength in the spectrum becomes short like about 360 nm. This phenomenon shows that, when the polarozation plane of the PL light is shifted from the polarozation plane intersecting orthogonally with the c axis to that being parallel with the c axis, PL light shifts from light generation due to transition to the HH band to light generation due to transition to the CH band.

In other words, transition to the HH band consisting of p orbits polarized in the x axis direction makes it possible to emit only a light whose polarozation plane is perpendicular to the c axis, nevertheless transition to the CH band make it possible for the first time to emit a light whose polarozation plane is parallel with the c axis because the CH band consists of p orbits polarized in the z axis direction.

In the second embodiment, if the polarozation plane of PL light of the semiconductor layer 2 and the wavelength are selected such that PL light intensity comes to its maximum, a wavelength of the PL light is mated with a resonance wavelength of the optical resonator. Optical energy in this wavelength is equal to photo luminescence energy caused by transition of electron to the HH band. Hence, if oscillation is forced in such wavelength, the oscillation light can be limited to only light generation due to transition of electron to the HH band. In this case, since light generation caused by transition to the CH band having the polarozation plane parallel with the c axis cannot be included in a mixed fashion, variation in the polarozation plane of the oscillation light can be prevented more firmly.

Such a resonance wavelength is not always requested that can achieve strictly maximum intensity. For instance, the wavelength may be selected to provide maximum intensity to such a degree that light generation due to transition of electrol to the HH band is caused mainly and light generation due to transition to the CH band is caused less and, as a result, shift of the oscillation mode from oscillation due to transition of electron to the HH band to oscillation due to transition of electron to the CH band can be suppressed.

In turn, the case where distortion is caused in the active layer will be explained.

FIGS.14A to 14E are views showing distortion of energy band of GaN and represents calculated values of energy in valence band of GaN having distortion therein. In FIG.11, distortion in <0001> orientation is $\epsilon z$, distortion in <11$\bar{2}$0> orientation is $\epsilon x$, and distortion in <1$\bar{1}$00> orientation is $\epsilon z$, and respective distortion values are represented under the assumption that compressive distortion is negative and tensile distortion is positive.

Figure 14A:
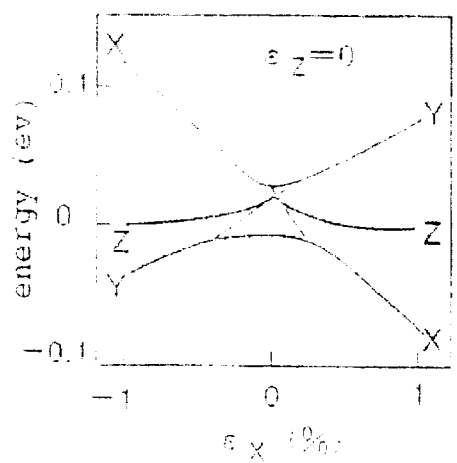
FIGS. 14A to 14E are views showing respectively crystal distortion dependence of energy band of GaN constituting the active layer in the surface emitting type semiconductor laser according to the second embodiment of the present invention.
Figure 14C:
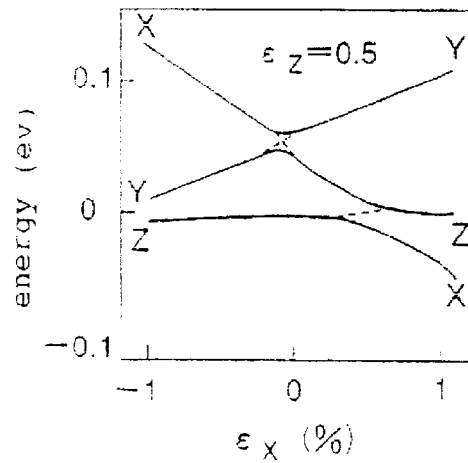
Figure 14B:
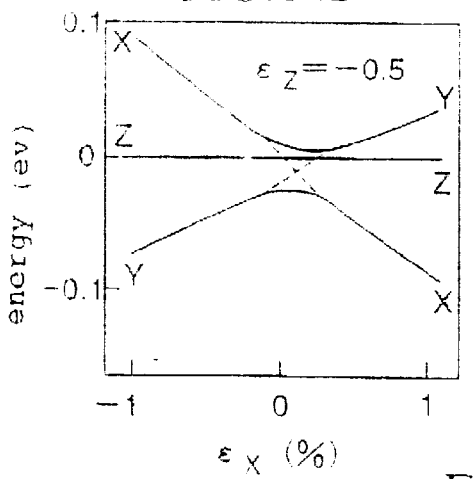
Figure 14D:
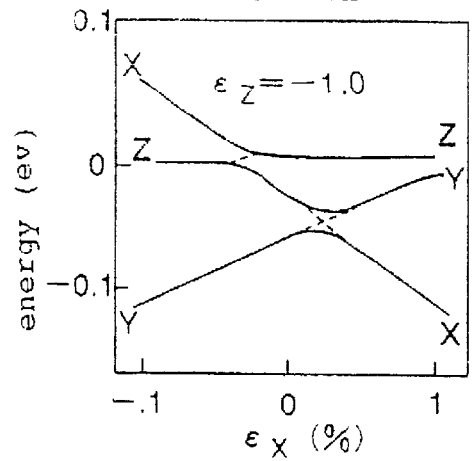

FIG.14A shows the case where $\epsilon z$=0 and $\epsilon x$ is varied. Where $\epsilon y$ is in a non-constraint state. In other words, FIGS.14A shows the calculated results of variation in energy in valence band if unixial distortion is imposed in the <11$\bar{2}$0> direction of the crystal. Similarly, FIG.14B shows the case where 0.5% tensile distortion is applied to $\epsilon z$ and in addition $\epsilon x$ is applied. FIGS.14C and 14D shows the case where 0.5% and 1.0% compressive distortion are applied to $\epsilon z$ respectively and in addition $\epsilon x$ is applied. Where $\epsilon y$ is in a non-constraint state.

Referring to FIGS.14A to 14C, if the $\epsilon x$ is compressive and $\epsilon z$ is more than 1.0% compressive distortion, X or Z branch consisting of p orbits is a band in valence band located at the bottom of the forbidden band (i.e., uppermost level in valence band) in the energy band structure. Hence, transition to X or Y branch is caused preferentially in luminescence transition from the conduction band. As a result, when the X branch is in the upper position, like the light generation caused when no distortion is applied, only the light having the polarozation plane perpendicular to the c axis can be oscillated. And, when the Z branch is in the place of the edge of band, the light parallel to the c axis is oscillated.

Referring to FIG.14D, if the $\epsilon z$ is more than 1% compressive distortion and $\epsilon x$ is tensile distortion, Z branch is higher in energy than X or Y branch. For this reason, transition to Z branch is caused preferentially in transition of electron from the conduction band to thus generate a light which oscillates in the polarozation plane parallel with the c axis. In the case, as above descriptions, the resonance direction of the face emitting semiconductor is perpendicularly to the face of the active layer, the electric field vector needs to be in a face of the active layer. Therefore, the polarization of the top band wave function needs to be in a face of the active layer. Namely, when the structure as shown in FIG.11 is taken in the face emitting semiconductor laser, the direction Y is the length of the resonator, therefore the face emitting semiconductor laser can not oscillate.

Figure 14E:
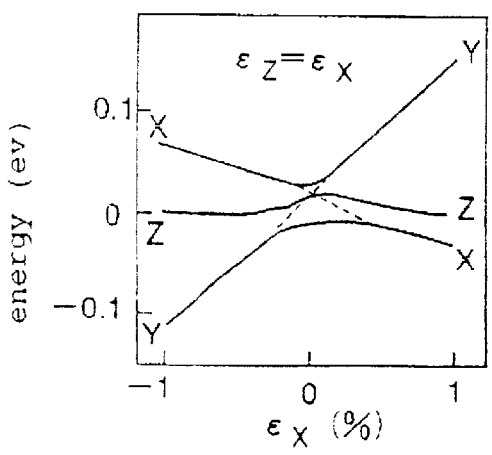

FIG.14E shows calculated values of energy band in valence band if $\epsilon y$ is in non-constraint state and $\epsilon z$=$\epsilon x$, in other words, if in-plane biaxial distortion is applied to the plane including <0001> and <11$\bar{2}$0>. For in-plane compressive strain, X is highest in energy. In this case, an oscillation light having the electric field direction parallel to the a axis occurs.

Like the above, where there caused distortion in the active layer, both oscillation lights having the polarozation plane perpendicular to the c axis and the polarozation plane parallel with the c axis are caused. However, since the polarozation plane of the oscillation light is defined uniquely by the optical axis of the optical resonator and the crystal axis direction in both cases, light polarization plane of the surface emitting type semiconductor laser can be defined in advance so that light polarization plane is fluctuated.

In the meanwhile, in the structure shown in FIG.10, either a multiple quantum well layer (MQW) including GaN, InGaN, or AlGaInN, or a single layer made of GaN, InGaN, or AlGaNInN may be used selectively as the active layer 42.

Further, an SiC substrate using 21 11$\bar{2}$0> plane as the principal plane may be employed as the substrate 41 shown in FIG.10. The SiC substrate using (1 $\bar{1}$00) plane as the principal plane, or a sapphire substrate using (1 $\bar{1}$02) plane as the principal plane may be employed.

Still further, a first conduction type first barrier layer 47, an active layer 42, and a second conduction type second barrier layer 48 are formed in sequence on the principal plane of the substrate 41, whereby a double hetero junction structure can be fabricated. If a reflection plane is formed over or below the double hetero junction structure, an optical resonator can be composed of the first barrier layer 47, the active layer 42, and the second barrier layer 48. If constituent material of the first barrier layer 47 and the second barrier layer 48 is made of AlGaN and then the active layer 42 is made of a single layer of AlGaN or GaN or InGaN, or a multiple quantum well layer (MQW) including such material, the surface emitting type semiconductor laser including the active layer 42 made of GaN system semiconductor in which the c axis lies in the plane can be achieved.

Next, the second embodiment of the present invention will be further explained with reference to FIGS.10 to 18B.

The inventors of the present invention had made it clear that, by measuring spectrum of PL light generation in the active layer 42, relationship between wavelength of the PL light generation and the polarozation plane can be explained based on light generation due to transition from the conduction band to the HH band and light generation due to transition from the conduction band to the CH band.

First, an undoped GaN thin film is deposited on the SiC substrate having (1 $\bar{1}$00) plane as the principal plane by virtue of well known MOVPE (metal organic vapor epitaxial growth) method, and then PL luminescence intensity has been measured as a function of polarozation plane orientation of PL light and wavelength.

Figure 15:
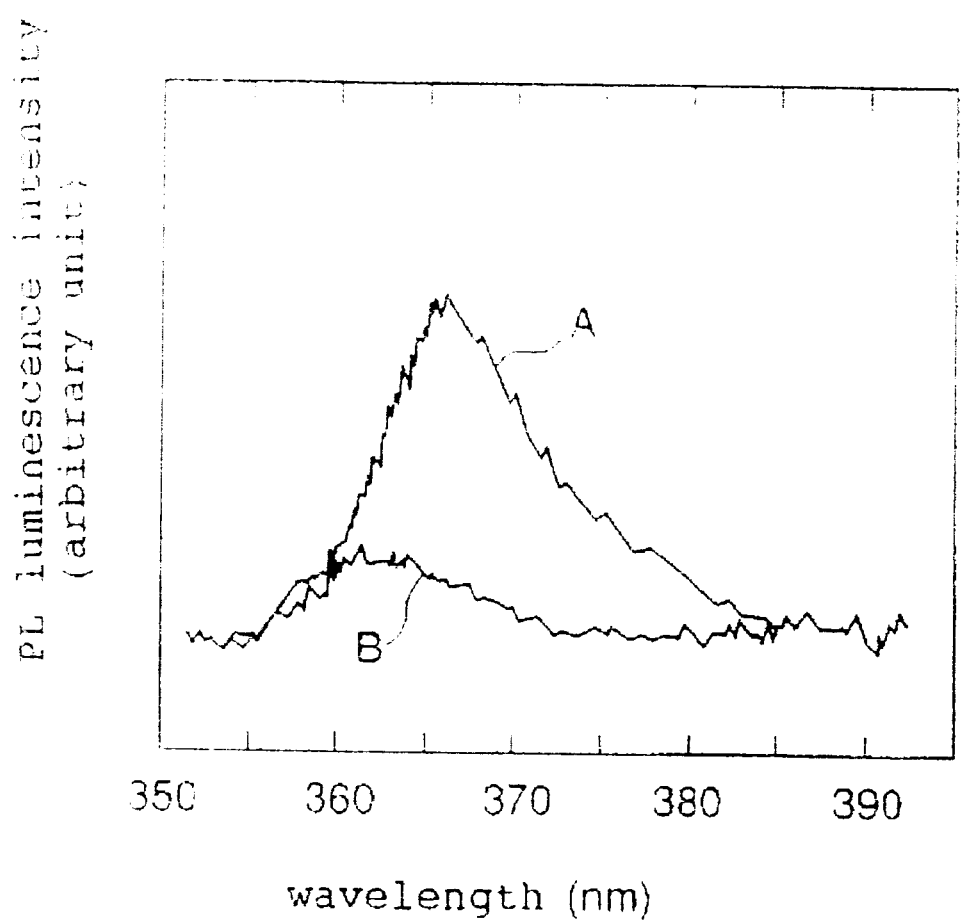
FIG. 15 is a characteristic view relationships between wavelength and PL luminescence intensity in accordance with experiment with the use of an angle between polarozation plane orientation in the active layer and c axis as a parameter in the surface emitting type semiconductor laser according to the second embodiment of the present invention.
Figure 16:
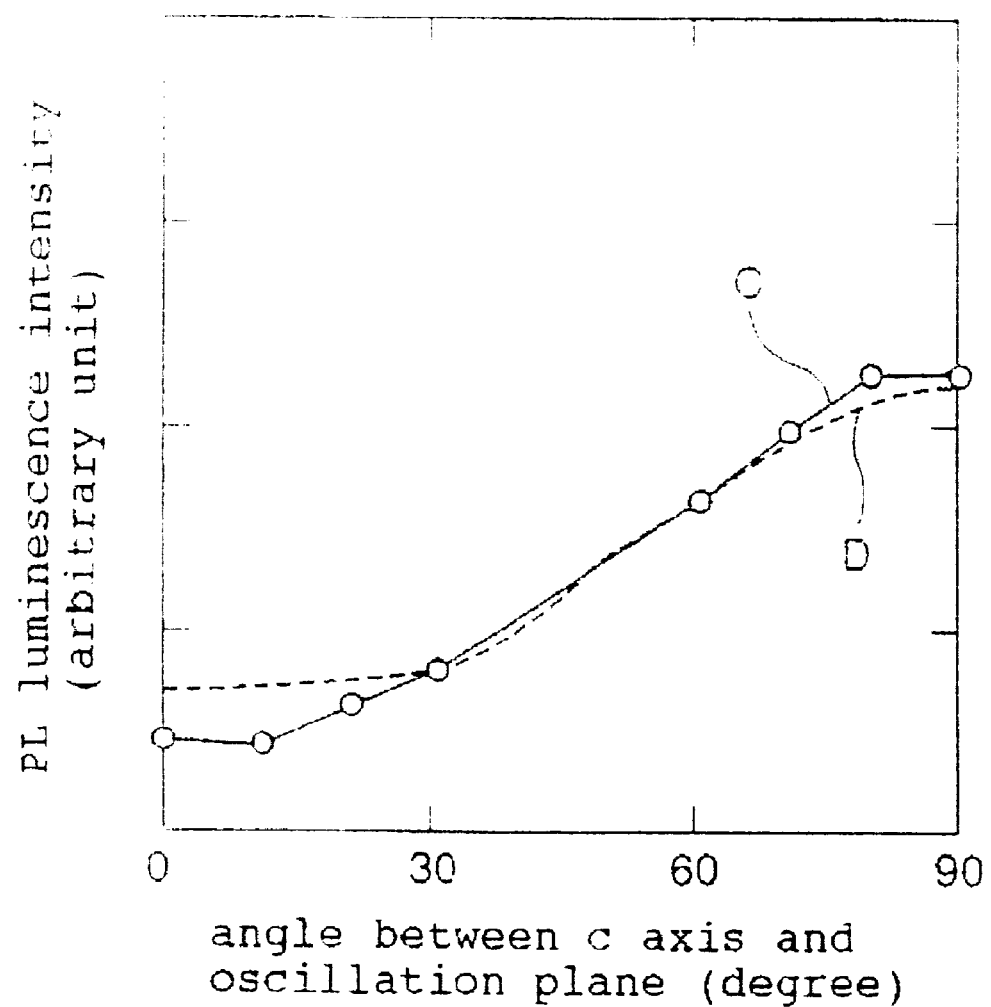
FIG. 16 is a characteristic view relationships between wavelength and PL luminescence intensity in accordance with both calculation and experiment with the use of an angle between polarozation plane orientation in the active layer and c axis as a parameter in the surface emitting type semiconductor laser according to the second embodiment of the present invention.

The results are given in FIGS.15 and 16. FIG.15 shows PL luminescence intensity of the active layer according to the second embodiment, and a symbol A in FIG.15 denotes a PL light whose electric field vector is perpendicular to the c axis and a symbol B denotes a PL light whose electric field vector is parallel with the c axis. FIG.16 shows electric field vector dependency of PL luminescence intensity of the active layer of the present invention, and represents change of maximum intensity (referred to a "peak intensity" hereinafter) of PL luminescence intensity according to the electric field vector when the polarozation plane is fixed.

In FIG.16, a symbol C denotes experiment values and a symbol D denotes calculation values.

In FIG.15, intensity A of the PL light having the polarozation plane perpendicular to the C axis has strong maximal near 366 nm. In contrast, intensity B of the PL light having the polarozation plane parallel to the c axis has weak maximal near 362 nm which is a shorter wavelength than 366 nm. Wavelengths at which these maximal values appear and the magnitude of these maximal values coincide with calculated values shown in FIG.13 precisely.

In FIG.16, the peak intensity of the PL light assumes a maximum value when the polarozation plane is perpendicular to the c axis while it assumes a minimum value when the polarozation plane is parallel with the c axis. The experiment values C coincide with the calculation values D with good precision.

This fact shows that the results of the calculation reappear the experiment.

FIG.17 is a sectional view showing a device into which the second embodiment is made further concrete, and the device is the surface emitting type semiconductor laser having a vertical resonator.

A GaN low temperature buffer layer 52 of 50 nm thickness, an n type GaN contact layer 49 of 0.5 $\mu$m thickness, an Si doped n type $Al_{10.1}Ga_{0.9}N$ barrier layer 47 of 1 $\mu$m thickness, an undoped GaN active layer 42 of 0.1 $\mu$m thickness, an Mg doped p type $Al_{10.1}Ga_{0.9}N$ barrier layer 48 of 1 $\mu$m thickness, and a p type GaN contact layer 51 are grown from the bottom in order on the substrate 41, for example, the SiC substrate 41 using (11$\bar{2}$0) plane as the principal plane by virtue of the MOVPE method.

In turn, a multi-layered film is formed by depositing an $SiO_2$ film of 30 nm thickness and an $Al_2O_3$ film of 30 nm thickness alternatively 20 times. The multi-layered film is patterned in terms of photolithography to form a DBR mirror 43 with a circular or rectangular planar shape. The DBR mirror 43 constitutes the vertical optical resonator for wavelength 366 nm with using a boundary surface between the n type contact layer 49 and the substrate 41 as a reflection face.

Then, respective layers located in the region on one side of the DBR mirror 43 are etched by the reactive ion etching (RIE) to thus expose part of the n type contact layer 49. Thereafter, an electrode 50a is formed of Ti in 100 nm thick on the exposed surface of the n type contact layer 49 and an electrode 50b is formed of Ni in 100 nm thick on the p type contact layer 51. In addition, an optical window is formed by polishing a back surface of the substrate 41 to emit the light, thereby finishing the surface emitting type semiconductor laser.

In such surface emitting type semiconductor laser, since the light is oscillated such that the perpendicular direction to the c axis of the substrate 41 becomes the oscillation direction of the electric field and therefore the polarozation plane is fixed, the laser light whose polarized direction is defined previously can be oscillated in a stable manner.

Other example of the surface emitting type semiconductor laser according to the second embodiment is that the active layer is formed to have a multiple quantum well layer structure. The AlN low temperature buffer layer 42 of 0.5 nm thickness, the n type GaN contact layer 49 of 0.5 $\mu$m thickness, the Si doped n type $A_{10.1}Ga_{0.9}N$ barrier layer 47 of 1 $\mu$m thickness, an active layer 42 formed of the multiple quantum well layer which is formed by depositing an $In_{0.15}Ga_{0.85}N$ well layer and an $In_{0.05}Ga_{0.95}N$ barrier layer alternatively 10 times, the Mg doped p type $A_{10.1}Ga_{0.9}N$ barrier layer 48 of 1 $\mu$m thickness, and the p type GaN contact layer 51 are grown from the bottom in order on the substrate 41, for example, the SiC substrate 41 using (11 $\bar{2}$0) plane as the principal plane by virtue of the MOVPE method. The surface emitting type semiconductor laser can be manufactured through similar steps to those in the above examples of the present embodiment.

In the surface emitting type semiconductor laser, polarization of the light is made uniform by employing the substrate using (1 $\bar{1}$00) plane or (11 $\bar{2}$0) plane as the principal plane. A substrate structure on which a light receiving device has already mounted together may be adopted as the substrate constituting such surface emitting type semiconductor laser.

Figure 18A:
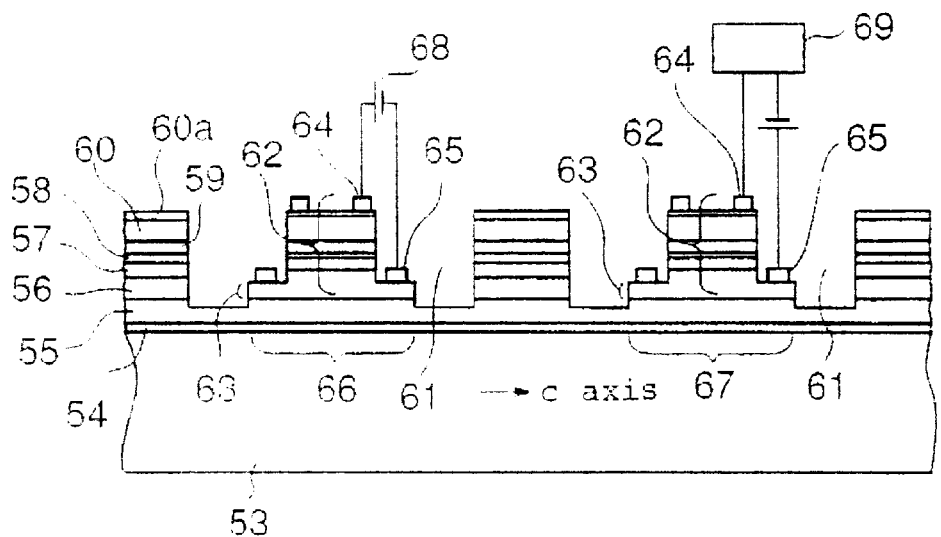
FIG. 18A is a sectional view showing a structure of an optical semiconductor device including the surface emitting type semiconductor laser and a light receiving device according to the second embodiment of the present invention.
Figure 18B:
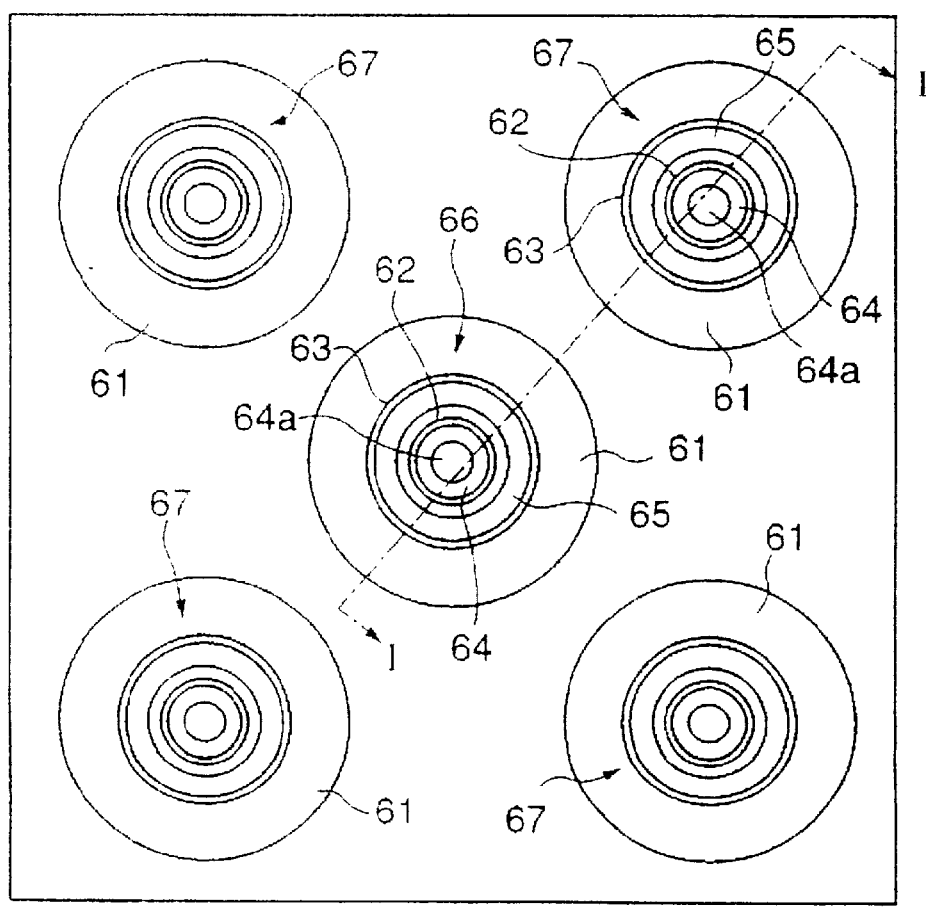
FIG. 18B is a plan view showing the structure of the optical semiconductor device in FIG. 18A.

FIG.18A is a sectional view showing an optical device in which the surface emitting type semiconductor laser (light emitting device) and the photo diode (light emitting device) are mounted together, and FIG.18B is a plan view showing the optical device in FIG.18A.

In FIGS.18A and 18B, an AlN high temperature buffer layer 57 of 50 nm thickness, a multi-layered mirror layer 55, an n type barrier layer 56 of 1 $\mu$m thickness, an undoped lower light confinement layer 57 of 500 nm thickness, an undoped MQW active layer 58, a p type barrier layer 59, an undoped upper light confinement layer 60 of 500 nm thickness, and a GaN contact layer 60a of 50 nm thickness are formed in order on (1 $\bar{1}$00) plane or (11 $\bar{2}$0) plane serving as the principal plane of the SiC substrate 53, in terms of the MOVPE method.

The mirror layer 55 is formed by laminating an $Al_{0.4}Ga_{0.6}N$ layer of 40 nm thickness and an $A_{10.1}Ga_{0.9}N$ layer of 40 nm thickness alternatively 30 times. The MQW active layer 58 has a structure in which the $In_{0.2}Ga_{0.8}N$ well layer of 4 nm thickness is sandwiched by the $In_{0.05}Ga_{0.95}N$ barrier layers of 5 nm thickness. The lower and upper light confinement layers 57, 60 are formed of GaN respectively.

In addition, the n type and p type barrier layers 56, 59 are formed of $Al_{0.1}Ga_{0.9}N$ respectively. Si is doped in the n type barrier layer 56 at impurity concentration of $2\times10^{18}$ atoms/$cm^3$ while Mg is doped in the p type barrier layer 59 at impurity concentration of $1\times10^{17}$ atoms/$cm^3$. Also Mg is doped in the contact layer 60a formed on the p type barrier layer 59 at impurity concentration of $1\times10^{18}$ atoms/$cm^3$.

A plurality of layers from the n type barrier layer 56 to the p type barrier layer 59 constitutes an SCH (Separate Confinement Hetero) structure.

Compound semiconductor layers, thus laminated, are worked to have a sectional shape and a planar shape shown in FIGS.18A and 18B respectively via patterning in plural times.

That is to say, the surface emitting type semiconductor laser 66 and the light receiving device 67 have the same shape. Respective layers from the contact layer 60a to the n type barrier layer 56 are formed to have a circular cylindrical portion 62 of 20 μm diameter, and respective layers from the n type barrier layer 56 to the mirror layer 55 are formed as a flange portion 63 extending from the circular cylindrical portion 62 externally. Since the undoped mirror layer 55 is made highly resistive, the circular cylindrical portion 62 and the flange portion 63 are electrically isolated from compound semiconductor layers in other regions via a substantially cylindrical groove 61.

A p side electrode 64 formed of annular Ti which has a light emitting window 64a of about 10 μm diameter in its central area is connected to an upper surface of the contact layer 60a in the circular cylindrical portion 62. An n side electrode 65 formed of Ni not to contact to the circular cylindrical portion 62 is connected to the n type barrier layer 56 in the flange portion 63.

A resonator in the film thickness direction is formed by the circular cylindrical portion 62, described above, and the n type barrier layer 56 formed beneath the portion 62.

As shown in FIG.18B, the photo diodes 67 are formed in plural number, say, four discretely around the surface emitting type semiconductor laser 66.

The optical device being equipped with the surface emitting type semiconductor laser 66 and the photo diodes 67 is fitted into an magneto-optic disk drive, for example. In the surface emitting type semiconductor laser 66, a positive bias voltage 68 is applied to the p side electrode 64 and the n side electrode 65 and therefore threshold current is supplied. In the photo diode 67, a backward bias voltage is applied to the p side electrode 64 and the n side electrode 65 and therefore current flowing through a detection circuit 69 is amplified according to an amount of incident light to the photo diode 67.

In this case, the surface emitting type semiconductor laser 66 oscillates to emit the light through the window 64a and is irradiated to the magneto-optic disk via diffraction grating, lense, etc. (not shown). The light reflected from the magneto-optic disk is input into four light receiving devices 67 via a lense and a polarizing prism. In the surface emitting type semiconductor laser 66, as already explained, since the light in which the oscillation direction of the electric field coincides with the direction perpendicular to the c axis of the substrate 41 is oscillated and the polarozation plane is fixed, light polarization planes of the laser light are made uniform. In addition, the laser light reflected from the magneto-optic disk is input into the photodiode 67 with the same light polarization plane.

In this manner, since the surface emitting type semiconductor laser 66 and the photodiode 67 formed on the same substrate can have the light polarization plane, the writing optical device and the reading optical device in the magneto-optic disk drive can be integrated so that miniaturization of the devices can be achieved and manufacturing efficiency can be improved.

As stated earlier, according to the second embodiment, in the vertical resonant type surface emitting type semiconductor laser having the resonance axis perpendicular to the active layer, since the polarozation plane of the oscillation light is defined uniquely based on crystal orientation, polarization orientation of the oscillation light can be specified in advance and therefore the vertical resonant type surface emitting type semiconductor laser having stable performance characteristics including less variation in polarization orientation can be provided. Hence, the laser can contribute significantly to improvement in performance of the information processing apparatus.

The active layer 58 may be formed any of GaN, InGaN, AlGaN, or AlGaInN. The barrier layers 57, 59 may be formed of any of GaN, InGaN, AlGaN, or AlGaInN. However, if the active layer 58 and the barrier layers 57, 59 are formed of the same material system, composition ratios must be so selected that energy bandgap of the active layer 58 is small rather than the barrier layers 57, 59.

Sapphire as well as silicon carbide (SiC) may be used as the substrate.

THIRD EMBODIMENT

In the conventional light emitting diode, circular polarization is brought along with respect to the light emitting direction. Therefore, if linear polarization is desired, linearly polarized light can be obtained by passing through a polarizer such as polaroid.

In the event that stereoscopic images are displayed in terms of the linearly polarized light, images for right eye and images for left eye are displayed by the lights each having a different polarization direction and then stereoscopic images can be perceived visually by watching via the polarizer for right eye and the polarizer for left eye each having a different polarization direction. In particular, in the case of the large size stereoscopic image display device, a projection system is employed.

However, there have been the problems that the number of items is increased because of the polarizers if linear polarization is tried to be achieved by the conventional light emitting diode, and the manufacturing cost is increased since a step of assembling the light emitting diodes and the polarizers is needed.

Since the circular polarization is transformed into the linear polarization to be polarized in a particular direction via the polarizer, the lights having different polarization direction from that of the polarizer cannot be output and thus are wasted. Therefore, there has been the problem that light generation efficiency is poor.

In addition, in the case of the large size stereoscopic image display device, like the conventional display device using the projection system, it become very difficult to watch display images in bright circumstances. Therefore, there has been the problem that the device cannot be substantially used practically.

FIG.19 is a view showing a principle structure of the third embodiment. A countermeasure of the present invention for overcoming the problems will be explained with reference to FIG.19.

Figure 19A:
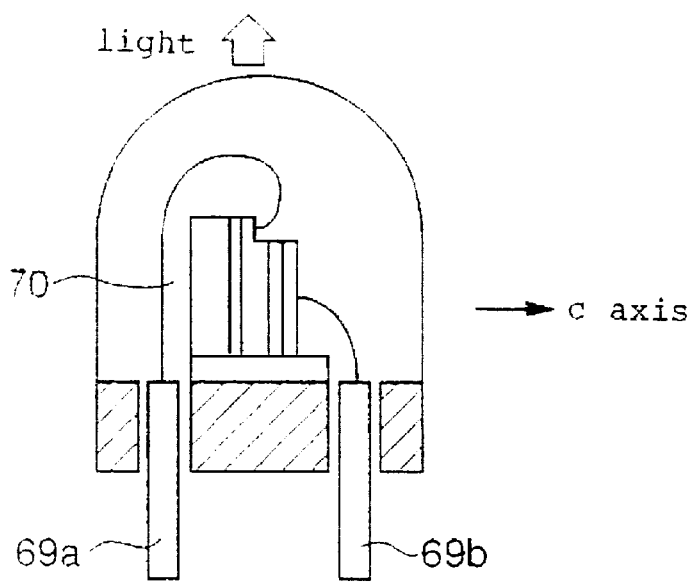
FIG. 19A is a schematic sectional view showing a packaged principle structure of an end-surface emitting type light emitting diode according to a third embodiment of the present invention.
Figure 19B:
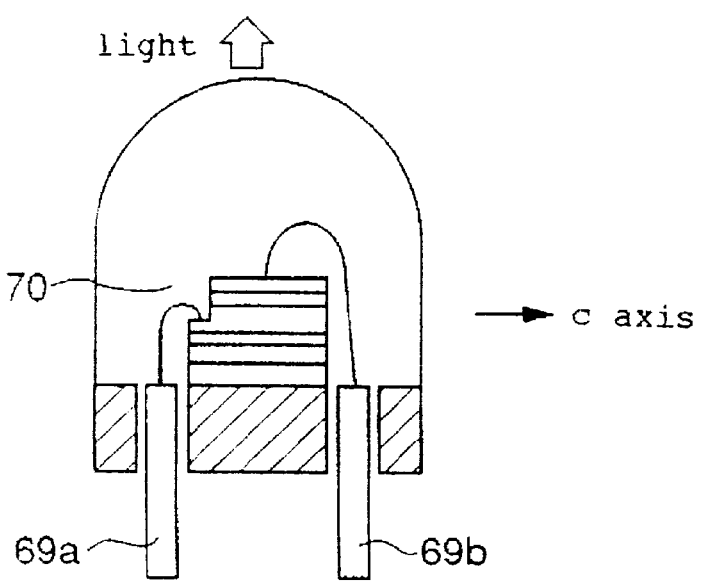
FIG. 19B is a schematic sectional view showing a packaged principle structure of another edge emitting type light emitting diode according to the third embodiment of the present invention.

As shown in FIGS.19A and 19B, the third embodiment is characterized in that the c axis direction of the wurtzite compound semiconductor crystal constituting a light emitting diode 70 substantially intersects with the light emission direction in the light emitting diode 70.

In the event that the wurtzite compound semiconductor such as GaN in used, the wurtzite compound semiconductor is a hexagonal system which is different from other III–V compound semiconductor such as GaAs. Light generation in the wurtzite compound semiconductor occurs according to transition of electron from the conduction band to the HH or LH band in valence band. Since the HH and LH bands are concerned with the a axis direction, the light polarized in the c axis direction, i.e., the direction perpendicular to <0001> direction appears strongly, but conversely the light polarized in the direction parallel with the c axis direction seldom appears. Therefore, the linearly polarized light can be obtained without the polarizer.

In the present invention, the meaning of "the c axis substantially intersects with the light emission direction " includes an angle range of ±5° other than "the c axis purely intersects with the light emission direction along which the light with maximum intensity is emitted".

The third embodiment is characterized in that the c axis direction of the wurtzite compound semiconductor crystal coincides with the crystal growth direction.

If {0001} face, {11 $\bar{2}$0} plane of sapphire, or {0001} plane of 6 H—SiC, or {111} plane of spinel crystal is used as the growth substrate, the crystal growth direction of the wurtzite compound semiconductor crystal is in the c axis direction. Therefore, as shown in FIG.1A, if the light is extracted in parallel with the active layer, the linearly polarized light can be achieved. In this disclosure, for convenience's sake, crystal orientation such as "1 bar" or "2 bar" is expressed by "–1" or "–2".

The third embodiment is characterized in that the c axis direction of the wurtzite compound semiconductor crystal substantially intersects with the crystal growth direction.

If r face, i.e., {1 $\bar{1}$02} plane of sapphire substrate, or {1 $\bar{1}$00} plane or {11 $\bar{2}$0} plane of 6 H—SiC is used as the principal plane of the growth substrate, the crystal growth direction of the wurtzite compound semiconductor crystal becomes parallel with the c axis direction. Therefore, as shown in FIG.1B, if the light is extracted perpendicularly to the active layer, the linearly polarized light can be achieved. Since the polarized light can be derived from a wide area, a wide light emitting area can be achieved. Further, the third embodiment is characterized in that the wurtzite compound semiconductor is formed of III–V compound semiconductor consisting of III nitride.

In this manner, if III–V compound semiconductor consisting of III nitride such as GaN system compound semiconductor, which has a stable crystal structure, is used as the wurtzite compound semiconductor, short wavelength light generation can be obtained with high efficiency over a wide range of 1.9 eV to 6.2 eV, so that a desired wavelength of the generated light can be obtained by adjusting a mixed crystal ratio.

Moreover, the third embodiment is characterized in that a plurality of light emitting diodes 70 made up of the wurtzite compound semiconductor crystal, the light emission direction of which substantially intersects with the c axis direction, are used in the display device, then the light emitting diodes 70 are aligned such that the light emitting diodes for right eye whose polarization direction is polarized in a certain direction u and the light emitting diodes for left eye whose polarization direction is polarized in a direction v perpendicular to the polarization direction u of the light emitting diodes for right eye are arranged, thereby yielding stereoscopic display.

In the case that the light emitting diodes 70 made up of the wurtzite compound semiconductor crystal, the light emission direction of which substantially intersects with the c axis direction, are polarized perpendicularly to the c axis direction, i.e., along the a axis and then the light emitting diodes 70 polarized along the a axis are rotated around the light emission direction by 90°, the linearly polarized light which is perpendicular to the c axis direction and is polarized perpendicularly to the polarization direction prior to rotation can be obtained. For this reason, display of stereoscopic image is made possible by assigning one light emitting diodes 70 to the right eye and other light emitting diodes 70 to the left eye.

In FIG.19, references 69a, 69b denote a pair of terminal to be connected to the light emitting diodes 70.

First Example

Figure 20A:
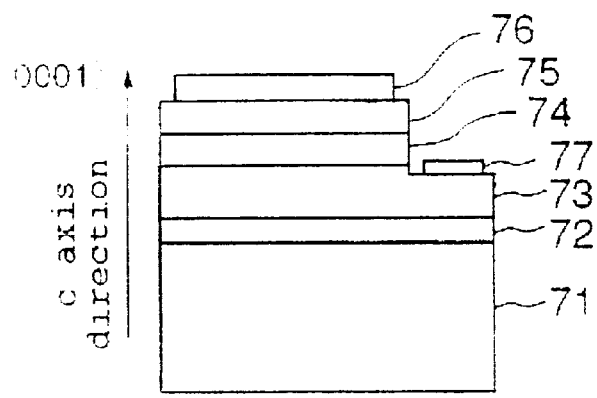
FIG. 20A is a side view showing a layer structure of the edge emitting type light emitting diode according to the third embodiment of the present invention.
Figure 20B:
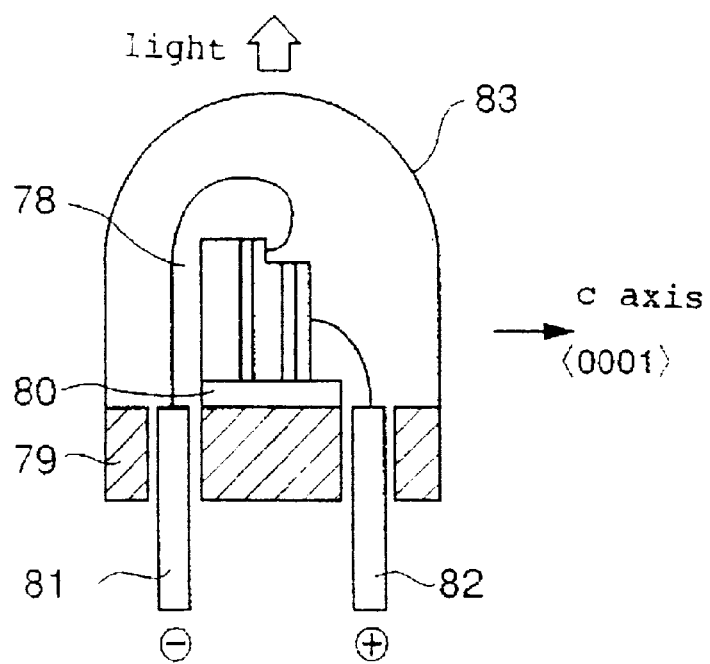
FIG. 20B is a schematic sectional view showing a packaged principle structure of the light emitting diode in FIG. 20A.
Figure 21A:
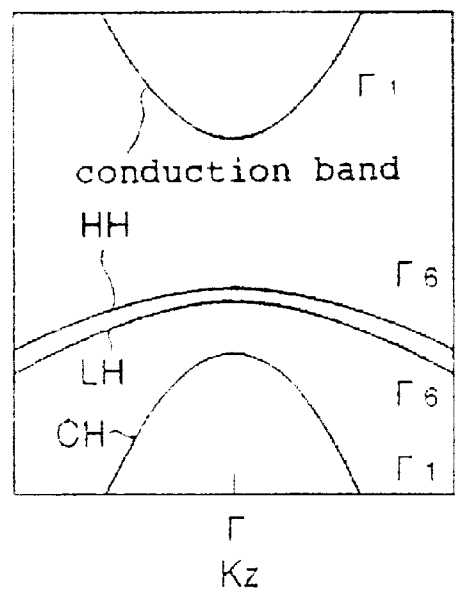
FIG. 21A is a band diagram showing an energy band structure of a GaN system compound semiconductor in the light emitting diode in FIG. 20A.
Figure 21B:
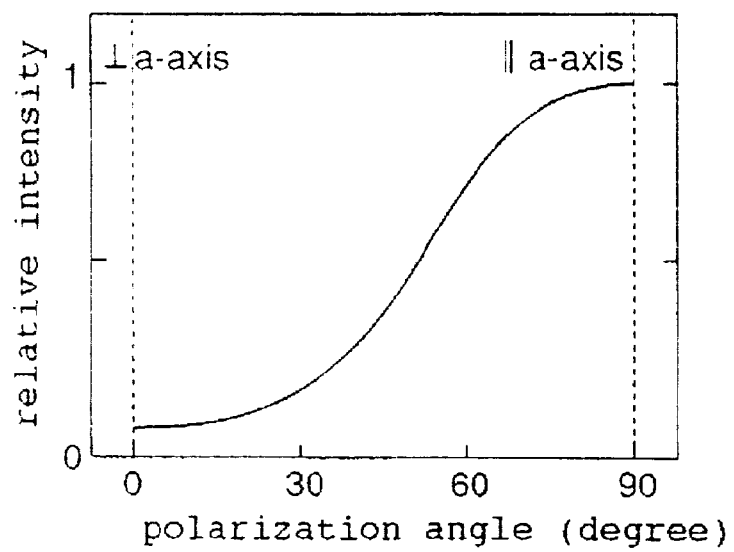
FIG. 21B is a characteristic view showing a polarizing angle relative to c axis of the light emitting diode in FIG. 20A, i.e., showing distribution of luminescence intensity with respect to the polarizing angle of the light emitting diode according to the third embodiment of the present invention if viewed from the light emission direction.

A first example of the third embodiment will be explained with reference to FIGS.20A and 20B and FIGS.21A and 21B. FIG.20A is a sectional view of the light emitting diode, and FIG.20B is a sectional view of the packaged light emitting diode. FIG.21A is a band diagram near a $\Gamma$ point of the GaN system compound semiconductor, and FIG.21 is a view showing distribution of luminescence intensity relative to the polarization angle.

As shown in FIG.20A, a GaN buffer layer 72 of 5 to 50 nm, for example, 20 nm thickness, an n type $Al_{0.05}Ga_{0.95}N$ layer 73 of 0.5 to 5.0 $\mu$m, for layer 75 of 10 to 100 nm, for example, 50 nm thickness, and a p type $Al_{0.05}Ga_{0.95}N$ layer 75 of 0.1 to 1.0 $\mu$m, for example, 0.5 $\mu$m thickness are epitaxially grown in order on a sapphire substrate 71 using (0001) plane, i.e., the c face as the principal plane by virtue of the MOVPE method.

Then, after the layers 74, 75 are etched by virtue of reactive ion etching to expose part of the n type $Al_{0.05}Ga_{0.95}N$ layer 73, an Ni electrode 76 is provided as a p side electrode on a surface of the p type $Al_{0.05}Ga_{0.95}N$ layer 75 and also a Ti electrode 77 is provided as an n side electrode on the exposed surface of the n type $Al_{0.05}Ga_{0.95}N$ layer 73.

In this case, since respective layers from the GaN buffer layer 72 to the p type $Al_{0.05}Ga_{0.95}N$ layer 75 are grown in the c axis direction of the sapphire substrate 71, the c axis is perpendicular to the principal plane of the sapphire substrate 71. The c axis direction is equivalent to <0001> direction.

As shown in FIG.20B, a light emitting diode 78 formed as above is mounted on a stem 79 such that the light emission direction is substantially perpendicular to the c axis.

In this event, the light emitting diode 78 is mounted on the stem 79 via an insulating spacer 80 to prevent short-circuit. The Ti electrode 77 serving as the n side electrode is then wire-bonded to a minus terminal 81, then the Ni electrode 76 serving as the p side electrode is then wire-bonded to a plus terminal 82, and then a resultant structure is resin-molded by means of epoxy resin, etc.

FIG.21A is a band diagram near a $\Gamma$ point of the GaN system compound semiconductor. As evident from FIG.21A, lowest energy bands viewed from holes in the valence band, i.e., HH and LH are degenerated doubly and are separated from each other in energy by spin orbit interaction, and CH band peculiar to the GaN system compound semiconductor appears.

In the GaN system compound semiconductor, light generation is caused due to transition among the conduction band, the HH band, and the LH band at the $\Gamma$ point, i.e., Kz=0. Since the HH band and the LH band at the $\Gamma$ point are related to the a axis direction, the light polarized in the direction perpendicular to the c axis can be obtained.

FIG.21B is a view showing distribution of luminescence intensity relative to the polarization angle viewed from the light emission direction of the light emitting diode in the third embodiment of the present invention. The light which is parallel with the a axis, i.e., polarized in the a axis direction can be obtained, nevertheless the light which is polarized by 90° with the a axis, i.e., polarized perpendicularly to the a axis seldom appears.

Accordingly, in the present invention, since the linearly polarized light polarized in a particular direction can be achieved without polarizers, etc., the number of items is not increased. Since a step of assembling the light emitting diodes and the polarizers is not needed, manufacturing cost can be made low.

In the first example, although the sapphire substrate using (0001) plane as the principal plane has been used as the substrate, the substrate is not limited to such sapphire substrate using (0001) plane as the principal plane, but the sapphire substrate using (11–20) plane as the principal plane, the 6 H—SiC substrate using (0001) plane as the principal plane, or the spinel substrate using (111) plane as the principal plane may be employed.

Second Example

Next, a second example of the third embodiment will be explained with reference to FIG.22.

Figure 22A:
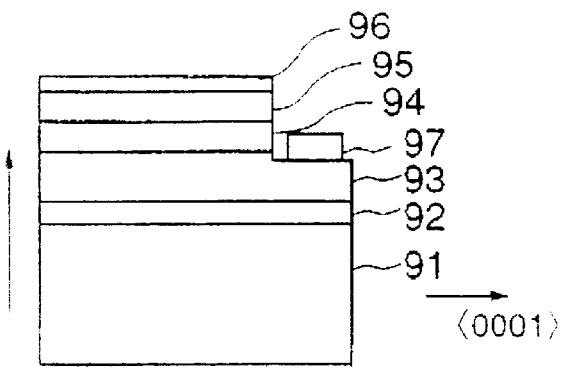
FIG. 22A is a side view showing a layer structure of the surface emitting type light emitting diode according to the third embodiment of the present invention.

First, as shown in FIG.22A, a GaN buffer layer 92 of 5 to 50 nm, for example, 20 nm thickness, an n type $Al_{0.05}Ga_{0.95}N$ layer 93 of 0.5 to 5.0 μm, for example, 3.0 μm thickness, an $In_{0.1}Ga_{0.9}N$ active layer 94 of 10 to 100 nm, for example, 50 nm thickness, and a p type $Al_{0.05}Ga_{0.95}N$ layer 95 of 0.1 to 1.0 μm, for example, 0.5 μm thickness are epitaxially grown in order on a sapphire substrate 91 using (1 $\bar{1}$02) face, i.e., $\Gamma$ face as the principal plane by virtue of the MOVPE method.

Then, after part of the n type $Al_{0.05}Ga_{0.95}N$ layer 93 is exposed by virtue of reactive ion etching, a semi-transparent electrode 96 made of very thin Ni is provided as a p side electrode on a surface of the p type $Al_{0.05}Ga_{0.95}N$ layer 95 and also a Ti electrode 97 is provided as an n side electrode on the exposed surface of the n type $Al_{0.05}Ga_{0.95}N$ layer 93.

In this case, since respective layers from the GaN buffer layer 92 to the p type $Al_{0.05}Ga_{0.95}N$ layer 95 are grown to direct the c axis direction along the direction in the face of the sapphire substrate 91, the c axis is parallel with the principal plane of the sapphire substrate 91.

Figure 22B:
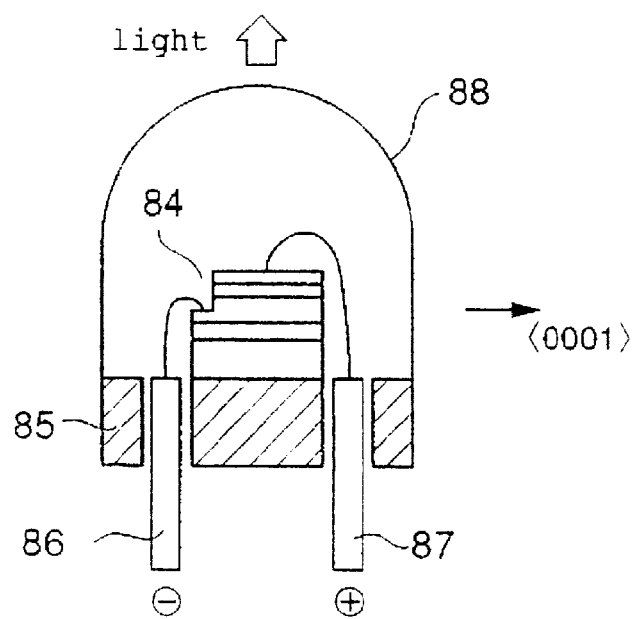
FIG. 22B is a schematic sectional view showing a packaged principle structure of the light emitting diode in FIG. 22A.

As shown in FIG.22B, a light emitting diode 84 formed as above is mounted by conductive past on a stem 85 such that the light emission direction is substantially perpendicular to the c axis.

The Ti electrode 97 serving as the n side electrode is then wire-bonded to a minus terminal 86, then the semi-transparent electrode 96 serving as the p side electrode is then wire-bonded to a plus terminal 87, and finally a resultant structure is resin-molded by means of epoxy resin, etc.

In this case, like the first example, since the light emission direction is perpendicular to the c axis, the light which is parallel with the a axis, i.e., polarized in the a axis direction can be obtained, nevertheless the light which is polarized by 90° with the a axis, i.e., polarized perpendicularly to the a axis seldom appears.

Accordingly, in the present invention, since the linearly polarized light polarized in a particular direction can be achieved without polarizers, etc., the number of items is not increased. Since a step of assembling the light emitting diodes and the polarizers is not needed, manufacturing cost can be made low.

In this second example, since the surface emitting type laser is used, a light emitting area can be widened rather than the first example. The luminescence intensity which stronger about ten times than the first example can be expected.

In addition, in the second example, although the sapphire substrate using $\Gamma$ face as the principal plane has been used as the substrate, the substrate is not limited to such sapphire substrate using $\Gamma$ face as the principal plane, but the SiC substrate using (1 $\bar{1}$00) plane as the principal plane, or the SiC substrate using (11 $\bar{2}$0) plane as the principal plane may be employed.

Still further, in the second example, although the semi-transparent electrode 96 made of very thin Ni film has been used as the p side electrode, such electrode is not limited to the semi-transparent electrode 96, but the light may be extracted through the mesh electrode if an ordinary thick Ni electrode is provided in a mesh-like fashion.

Third Example

Next, a third example of the third embodiment will be explained with reference to FIG.23.

Figure 23:
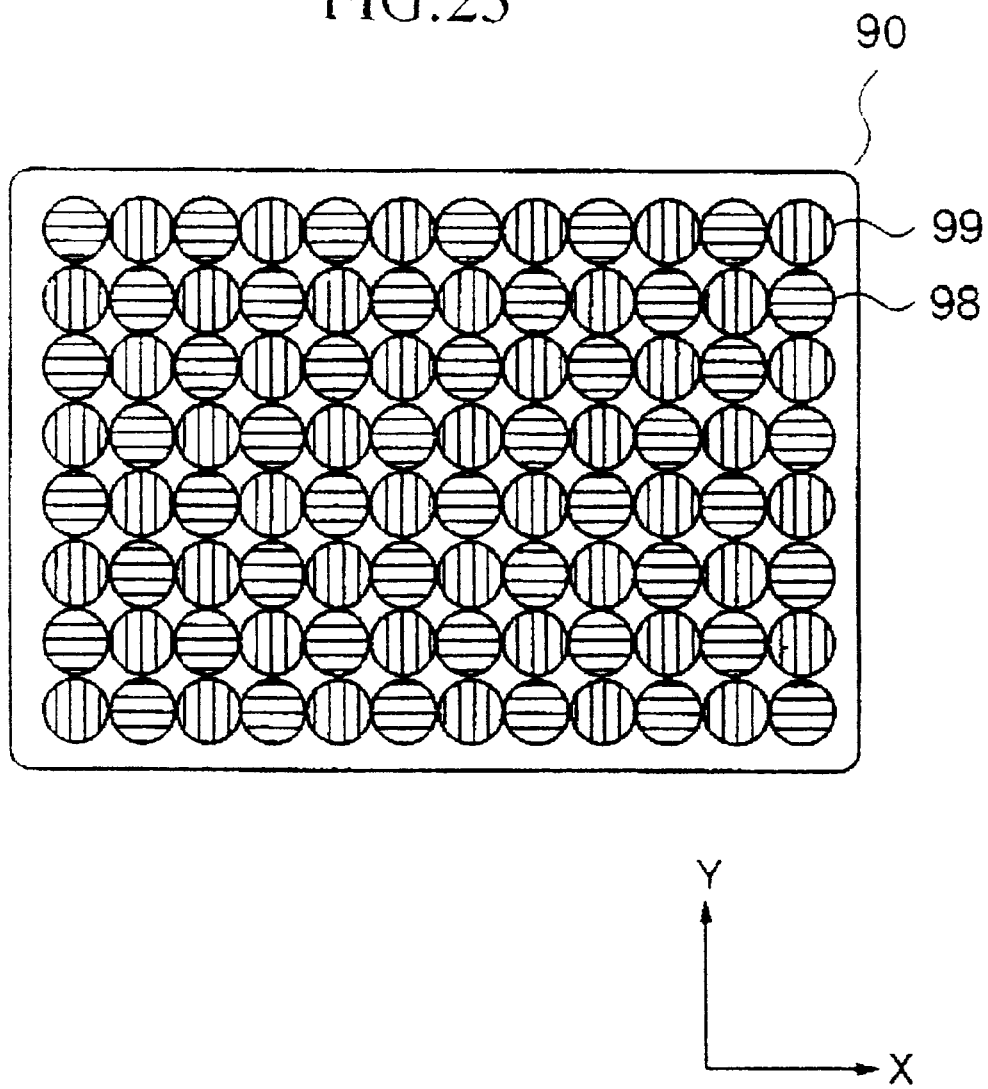
FIG. 23 is a plan view showing polarized states of the light emitting diodes according to the third embodiment of the present invention for use in a display device.
Figure 24A:
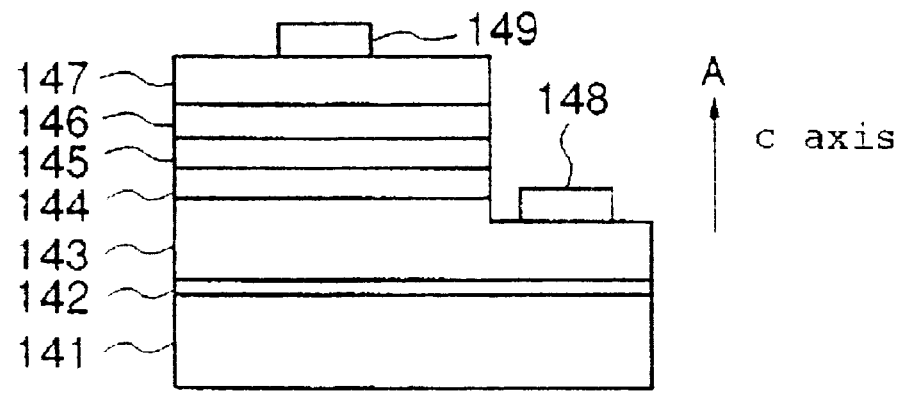
FIG. 24A is a sectional view showing a first example of a semiconductor diode in the prior art.
Figure 24B:
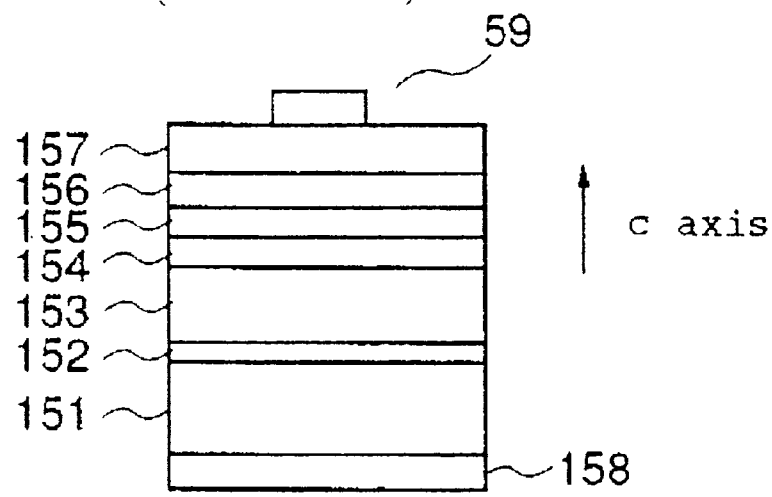
FIG. 24B is a sectional view showing a second example of a semiconductor diode in the prior art.
Figure 25A:
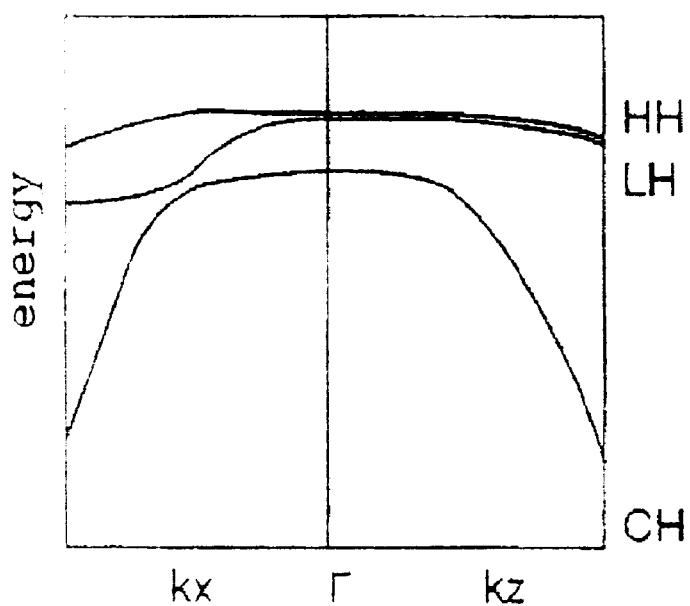
FIGS. 25A and 25B are band diagrams each showing an energy band structure of valence band of the semiconductor diode in the prior art.
Figure 25B:
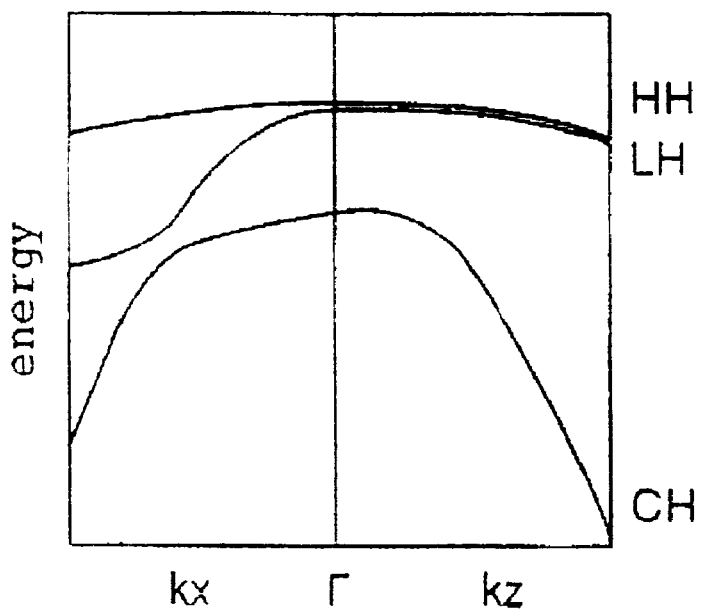

FIG.23 represents a stereoscopic image display panel 90 using the light emitting diodes discussed in the first and second examples. For instance, using the light emitting diodes in the first example, the display panel 90 is formed by combining light emitting diodes 98 arranged such that the polarization direction is directed in the X direction with light emitting diodes 99 polarized in the Y direction and arranged such that the polarization direction is rotated around the optical axis of the light emitting diodes 98 by 90°. The X and Y directions are parallel with a surface of the display panel 90 and the X direction and the Y direction are set to intersect with each other.

In this event, if the light emitting diodes 98 are assigned to the right eye and the light emitting diodes 99 are assigned to the left eye, then different image input signals are input into the diodes 98, 99, and then the display images are monitored via different polarizers for right and left eyes, stereoscopic images can be displayed.

In this case, the light having the polarization angle in the range of about ±20° relative to the direction which is purely parallel with the a axis direction can be used effectively.

Since the display device in the third example uses photo luminescence display, brightness can be made higher than the conventional stereoscopic display device using the projection system. Accordingly, if a large size display device is used, it may be used in the brighter circumstance.

In this event, for instance, the 100 inch display panel 90 is formed by about two million pixels. As shown in FIG.23, the light emitting diodes 98 polarized in the X direction and the light emitting diodes 99 polarized in the Y direction may be arranged alternatively one by one, otherwise plural light emitting diodes which being grouped into several pixels, though not shown, may be arranged alternatively. In addition, color display is enabled by adjusting photo luminescence wavelength of respective light emitting diodes.

The face orientations in the above embodiments are mere examples, all faces being crystallographically equivalent to the face orientation set forth above should be included.

In the above examples, although In$_{0.1}$Ga$_{0.9}$N in which an In composition ratio is 0.1 has been used as the active layer, mixed crystal ratio may be varied in the range of Al$_x$In$_y$Ga$_{l-x-y}$N ($0 \leq x \leq 1$, $0 \leq y \leq 1$) according to the wavelength required. Correspondingly, the p type Al$_{0.05}$Ga$_{0.95}$N layer and the n type Al$_{0.05}$Ga$_{0.95}$N layer, which are formed to sandwich the active layer, may be formed of Al$_a$In$_b$Ga$_{l-a-b}$N ($0 \leq a \leq 1$, $0 \leq b \leq 1$) which has a wider forbidden band than the active layer.

If the sapphire substrate is used in place of the GaN substrate, the principal plane of the substrate is selected as (11$\bar{2}$0) face.

With the above description, according to the third embodiment, in the event that the light emitting diodes are composed of the wurtzite compound semiconductor such as GaN system compound semiconductor, the linearly polarized light can be output without polarizer if the light emission direction is set perpendicularly to the c axis of the wurtzite compound semiconductor, and the stereoscopic image display device can be composed wherein photo luminescence display is employed and can be used in the brighter circumstance if the light emitting diodes polarized linearly as above are used.

Various modifications will become possible for those skilled in the art after receiving the teachings of the present disclosure without departing from the scope thereof.

What is claimed is:

1. A semiconductor light emitting device comprising:
   a second semiconductor layer formed directly on a principal plane of a crystal substrate via a first semiconductor layer;
   an active layer formed on said second semiconductor layer and having an energy band gap which is smaller than an energy band gap of said second semiconductor layer, said active layer is made of semiconductor having uniaxial anisotropy;
   a third semiconductor layer formed on said active layer and having an energy band gap which is larger than an energy band gap of said active layer; and,
   a pair of electrodes for supplying current to said second semiconductor layer, said active layer, and said third semiconductor layer in a film thickness direction,
   wherein said film thickness direction of at least said active layer is different from an axis of said uniaxial anisotropy, said active layer has triaxis anisotropy by applying distortion in a plane which is not perpendicular to a c axis exhibiting anisotropy, and light is emitted vertically relative to said principal plane.

2. A semiconductor light emitting device according to claim 1, wherein said semiconductor of active layer is wurtzite nitride.

3. A semiconductor light emitting device according to claim 1, wherein said substrate is made of GaN, AlN or SiC, and
   said principal a plane is $\{1\bar{1}00\}$ plane, $\{11\bar{2}0\}$ plane or a plane of said substrate inclined at –5 to +5 degree with said a $\{1\bar{1}00\}$ plane or said $\{11\bar{2}0\}$ plane.

4. A semiconductor light emitting device according to claim 1, wherein said crystal substrate is formed of a LiAlO$_2$ substrate,
   said principal plane is either a $\{100\}$ plane or face inclined at an angle of –5 to +5 degree with said $\{100\}$ face.

5. A semiconductor light emitting device according to claim 1, wherein said active layer is formed of Al$_x$Ga$_{l-x-y}$In$_y$N (where $0 \leq x \leq 1$ and $0 \leq y \leq 1$).

6. A semiconductor light emitting device according to claim 1, furthermore comprising
   a mirror layer is formed beneath said second semiconductor layer or on said third semiconductor layer, and
   a resonator is formed using said mirror layer as one end surface in a film thickness direction of said active layer, said second semiconductor layer, and said third semiconductor layer.

7. A semiconductor light emitting device according to claim 6, wherein a resonance wavelength of said resonator is a wavelength which renders photo luminescence light intensity maximum.

8. A semiconductor light emitting device according to claim 6, wherein said active layer is formed of any of a multiple quantum well layer having a multi-layered structure of a first layer made of GaN or InGaN and a second layer made of AlGaInN or GaN or InGaN, a GaN single layer, an InGaN single layer, and an AlGaInN single layer.

9. A semiconductor light emitting device according to claim 6, wherein said principal plane of said crystal substrate is a $\{11\bar{2}0\}$ plane or a $\{1\bar{1}00\}$ plane of an SiC substrate, or a $\{1\bar{1}02\}$ plane of a sapphire substrate.

10. A semiconductor light emitting device comprising:
    a first barrier layer formed of a first conductive type AlGaN which is deposited on an SiC substrate using a $\{1120\}$ plane as a principal plane;
    an active layer formed of a multiple quantum well layer including an InGaN layer, a multiple quantum well layer including an AlGaN layer, a GaN single layer, and an InGaN single layer, which is deposited on said first barrier layer, said active layer having a c axis exhibiting anisotropy along its face of a light emitted surface;
    a second barrier layer formed of a second conductive type AlGaN which is deposited on said active layer;
    an optical resonator formed in a film thickness direction, said optical resonator being formed by using a reflection mirror which is made of a multi-layered film provided on said second barrier layer as a first reflection surface and having a second reflection surface beneath said first barrier layer; and
    a first electrode and a second electrode.

11. A light emitting diode comprising:
    a second semiconductor layer formed on a principal plane of a wurtzite compound semiconductor crystal substrate via a first semiconductor layer;
    an active layer formed on said second semiconductor layer and having an energy band gap which is smaller than an energy band gap of said second semiconductor layer, said active layer is made of a semiconductor having uniaxial anisotropy;
    a third semiconductor layer formed on said active layer and having an energy band gap which is larger than an energy band gap of said active layer;
    a pair of electrodes for supplying current to said second semiconductor, said active layer, and said third semiconductor layer in a film thickness direction; and
    said film thickness direction of at least said active layer is different from an axis of said uniaxial anisotropy;
    wherein a c axis of a wurtzite compound semiconductor crystal intersects substantially orthogonally with a light emission direction vertical to the substrate surface.

12. A light emitting diode according to claim 11, wherein said c axis of said wurtzite compound semiconductor crystal intersects substantially orthogonally with a crystal growth direction.

13. A light emitting diode according to claim 11, wherein said wurtzite compound semiconductor crystal is III–V compound semiconductor formed of III nitride.

14. A display device comprising:
a first group of light emitting diodes each formed of a wurtzite compound semiconductor crystal in which a light emission direction intersects substantially orthogonally with a c axis, said first group of light emitting diodes emitting light with a first polarization direction; and
a second group of light emitting diodes each formed of a wurtzite compound semiconductor crystal in which a light emission direction intersects substantially orthogonally with a c axis, said second group of light emitting diodes emitting light with a second polarization direction perpendicular to said first polarization direction.

15. A semiconductor light emitting device comprising:
a second semiconductor layer formed directly on a principal plane of a crystal substrate;
an active layer formed on said second semiconductor layer and having an energy band gap which is smaller than an energy band gap of said second semiconductor layer, and active layer is made of semiconductor having uniaxial anisotropy;
a third semiconductor layer formed on said active layer and having an energy band gap which is larger than an energy band gap of said active layer; and
a pair of electrodes for supplying current to said second semiconductor layer, said active layer, and said third semiconductor layer in a film thickness direction;
wherein said film thickness direction of at least said active layer is different from an axis of said uniaxial anisotropy, said active layer has triaxis anisotropy by applying distortion in a plane which is not perpendicular to a c axis exhibiting anisotropy, and light is emitted vertically relative to said principal plane.

16. A semiconductor light emitting device according to claim 15, wherein said semiconductor of active layer is wurtzite nitride.

17. A semiconductor light emitting device according to claim 15, wherein said substrate is made of GaN, AlN or SiC, and
said principal plane is a $\{1\bar{1}00\}$ plane, a $\{11\bar{2}0\}$ plane or a plane of said substrate inclined at −5 to +5 degree with said $\{1\bar{1}00\}$ plane or said $\{11\bar{2}0\}$ plane.

18. A semiconductor light emitting device according to claim 15, wherein said crystal substrate is formed of a LiAlO$_2$ substrate,
said principal plane is either a $\{100\}$ plane or face inclined at an angle of −5 to +5 degree with said $\{100\}$ face.

19. A semiconductor light emitting device according to claim 15, wherein said active layer is formed of $Al_xGa_{1-x-y}In_yN$ (where $0 \leq x \leq 1$ and $0 \leq y \leq 1$).

20. A semiconductor light emitting device according to claim 15, furthermore comprising
a mirror layer formed beneath said second semiconductor layer or on said third semiconductor layer, and
a resonator formed using said mirror layer as one end surface in a film thickness direction of said active layer, said second semiconductor layer, and said third semiconductor layer.

21. A semiconductor light emitting device according to claim 20, wherein a resonance wavelength of said resonator is a wavelength which renders photo luminescence light intensity maximum.

22. A semiconductor light emitting device according to claim 20, wherein said active layer is formed of any of a multiple quantum well layer having a multi-layered structure of a first layer made of GaN or InGaN and a second layer made of AlGaInN or GaN or InGaN, a GaN single layer, an InGaN single layer, and an AlGaInN single layer.

23. A semiconductor light emitting device according to claim 20, wherein said principal plane of said crystal substrate is a $\{11\bar{2}0\}$ plane or a $\{1\bar{1}00\}$ plane of an SiC substrate, or a $\{1\bar{1}02\}$ plane of a sapphire substrate.

24. A semiconductor light emitting device comprising:
a second semiconductor layer formed directly on a principal plane of a crystal substrate via a first semiconductor layer;
an active layer formed on said second semiconductor layer and having an energy band gap which is smaller than an energy band gap of said second semiconductor layer, said active layer is made of semiconductor having uniaxial anisotropy;
a third semiconductor layer formed on said active layer and having an energy band gap which is larger than an energy band gap of said active layer; and,
a pair of electrodes for supplying current to said second semiconductor layer, said active layer, and said third semiconductor layer in a film thickness direction,
wherein said film thickness direction of at least said active layer is different from an axis of said uniaxial anisotropy, said active layer has triaxis anisotropy by applying distortion in a plane which is not perpendicular to a c axis exhibiting anisotropy.

25. A semiconductor light emitting device according to claim 24, wherein said semiconductor of active layer is wurtzite nitride.

26. A semiconductor light emitting device according to claim 24, wherein said crystal substrate is made of GaN, AlN or SiC, and
said principal plane is a $\{1\bar{1}00\}$ plane, a $\{11\bar{2}0\}$ plane or a plane of said substrate inclined at −5 to +5 degree with said $\{1\bar{1}00\}$ plane or said $\{11\bar{2}0\}$ plane.

27. A semiconductor light emitting device according to claim 24, wherein said crystal substrate is formed of a LiAlO$_2$ substrate,
said principal plane is either a $\{100\}$ plane or face inclined at an angle of −5 to +5 degree with said $\{100\}$ face.

28. A semiconductor light emitting device according to claim 24, wherein said active layer is formed of $Al_xGa_{1-x-y}In_yN$ (where $0 \leq y \leq 1$).

29. A semiconductor light emitting device according to claim 24, wherein said crystal substrate, said second semiconductor layer, said third semiconductor layer, and said active layer are cleaved along one of a $\{0001\}$ plane, a $\{1\bar{1}00\}$ plane and a $\{11\bar{2}0\}$ plane.

30. A semiconductor light emitting device according to claim 24, wherein said principal plane of said crystal substrate is a facet with face orientation intersecting with $\{0001\}$ plane, and said active layer formed on said facet is used as a light emitting portion.

31. A semiconductor light emitting device according to claim 30, wherein said facet is formed to have a face orientation perpendicular to either a $\{1\bar{1}00\}$ plane or $\{11\bar{2}0\}$ plane or a $\{0001\}$ plane, and said $\{1\bar{1}00\}$ plane or said $\{11\bar{2}0\}$ plane or said $\{0001\}$ plane is a cleavage plane on both ends of a resonator.

32. A semiconductor light emitting device according to claim 24, wherein the thickness of said active layer is 1–20 nm.

33. A semiconductor light emitting device comprising:
- a second semiconductor layer formed directly on a principal plane of a crystal substrate;
- an active layer formed on said second semiconductor layer and having an energy band gap which is smaller than an energy band gap of said second semiconductor layer, said active layer is made of semiconductor having uniaxial anisotropy;
- a third semiconductor layer formed on said active layer and having an energy band gap which is larger than an energy band gap of said active layer; and
- a pair of electrodes for supplying current to said second semiconductor layer, said active layer, and said third semiconductor layer in a film thickness direction;
- wherein said film thickness direction of at least said active layer is different from an axis of said uniaxial anisotropy, said active layer has triaxis anisotropy by applying distortion in a plane which is not perpendicular to a c axis exhibiting anisotropy.

34. A semiconductor light emitting device according to claim 33, wherein said semiconductor of active layer is wurtzite nitride.

35. A semiconductor light emitting device according to claim 33, wherein said substrate is made of GaN, AlN or SiC, and
said principal plane is a $\{1\bar{1}00\}$ plane, a $\{11\bar{2}0\}$ plane or a plane of said substrate inclined at −5 to +5 degree with $\{1\bar{1}00\}$ plane or said $\{11\bar{2}0\}$ plane.

36. A semiconductor light emitting device according to claim 33, wherein said crystal substrate is formed of a $LiAlO_2$ substrate,
said principal plane is either a $\{100\}$ plane or face inclined at an angle of −5 to +5 degree with said $\{100\}$ face.

37. A semiconductor light emitting device according to claim 33, wherein said active layer is formed of $Al_xGa_{1-x-y}In_yN$ (where $0 \leq x \leq 1$ and $0 \leq y \leq 1$).

38. A semiconductor light emitting device according to claim 33, wherein said crystal substrate, said second semiconductor layer, said third semiconductor layer, and said active layer are cleaved along one of a $\{0001\}$ plane, a $\{1\bar{1}00\}$ plane and a $\{11\bar{2}0\}$ plane.

39. A semiconductor light emitting device according to claim 33, wherein said principal plane of said crystal substrate is a facet with face orientation intersecting with a $\{0001\}$ plane, and said active layer formed on said facet is used as a light emitting portion.

40. A semiconductor light emitting device according to claim 39, wherein said facet is formed to have face orientation perpendicular to either a $\{1\bar{1}00\}$ plane or a $\{11\bar{2}0\}$ plane or a $\{0001\}$ plane, and said $\{1\bar{1}00\}$ or said $\{11\bar{2}0\}$ plane or said $\{0001\}$ is a cleavage plane on both ends of a resonator.

41. A semiconductor light emitting device according to claim 33, wherein the thickness of said active layer is 1–20 nm.

* * * * *